United States Patent
Ikeda et al.

(10) Patent No.: US 10,418,779 B2
(45) Date of Patent: Sep. 17, 2019

(54) LASER DRIVING CONTROL APPARATUS, DRYING APPARATUS, IMAGE FORMING APPARATUS, COMPUTER READABLE MEDIUM STORING LASER DRIVING CONTROL PROGRAM, AND COMPUTER READABLE MEDIUM STORING DRYING PROGRAM

(71) Applicant: FUJI XEROX CO., LTD., Tokyo (JP)

(72) Inventors: Chikaho Ikeda, Ebina (JP); Shigeyuki Sakaki, Ebina (JP); Akira Sakamoto, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 15/964,312

(22) Filed: Apr. 27, 2018

(65) Prior Publication Data

US 2019/0199059 A1    Jun. 27, 2019

(30) Foreign Application Priority Data

Dec. 26, 2017 (JP) .................................. 2017-249850

(51) Int. Cl.
   *H01S 5/042*   (2006.01)
   *B41J 11/00*   (2006.01)

(52) U.S. Cl.
   CPC ........... *H01S 5/0428* (2013.01); *B41J 11/002* (2013.01)

(58) Field of Classification Search
   CPC ............................. B41J 11/002; H01S 5/0428
   See application file for complete search history.

(56) References Cited

U.S. PATENT DOCUMENTS

| 5,946,334 A | * | 8/1999 | Ema | ................. | H01S 5/042 372/26 |
|---|---|---|---|---|---|
| 6,700,423 B1 | * | 3/2004 | Miki | ................. | H03K 5/04 327/172 |
| 2012/0206427 A1 | * | 8/2012 | Yamamuro | ......... | G09G 3/3406 345/207 |

FOREIGN PATENT DOCUMENTS

| JP | 5247889 | 4/2013 |
|---|---|---|
| WO | 2011/052418 | 5/2011 |

* cited by examiner

*Primary Examiner* — Julian D Huffman
(74) *Attorney, Agent, or Firm* — Fildes & Outland, P.C.

(57) ABSTRACT

A laser driving control apparatus includes: a driver that constant-voltage drives a laser light source that radiates laser light by supplying a pulse signal in which a plurality of pulses, each pulse width thereof being changeable, is generated at a predetermined cycle; and a controller that performs control to change the pulse width of each of the plurality of pulses so that a first change amount of the pulse width when a present-time pulse width is changed to a preceding pulse width prior to reaching a pulse width at which a target light quantity is obtained stably is larger than a second change amount of the pulse width when the present-time pulse width is changed to a target pulse width corresponding to a driving current at an ON time of the laser light source in a steady state in which the target light quantity is obtained stably.

15 Claims, 24 Drawing Sheets

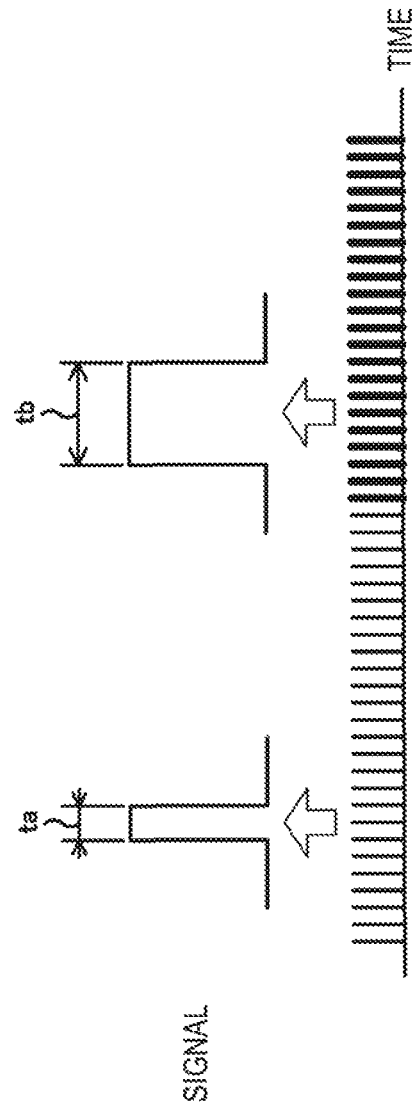
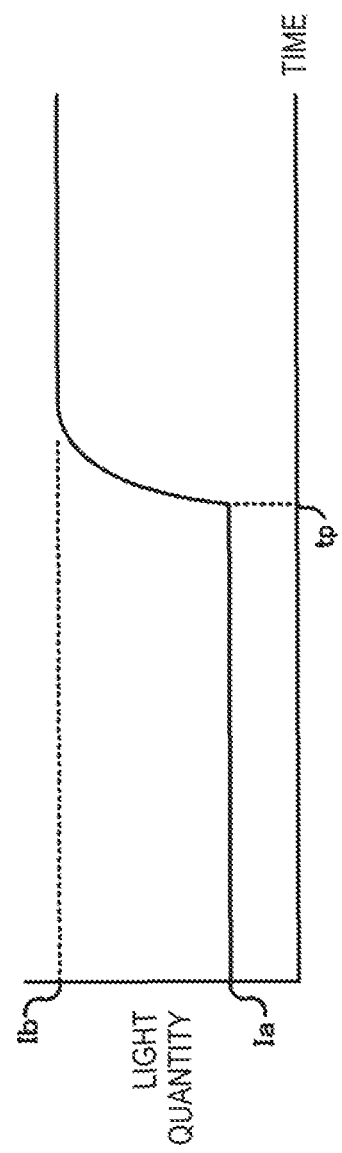
FIG. 2A
FIG. 2B

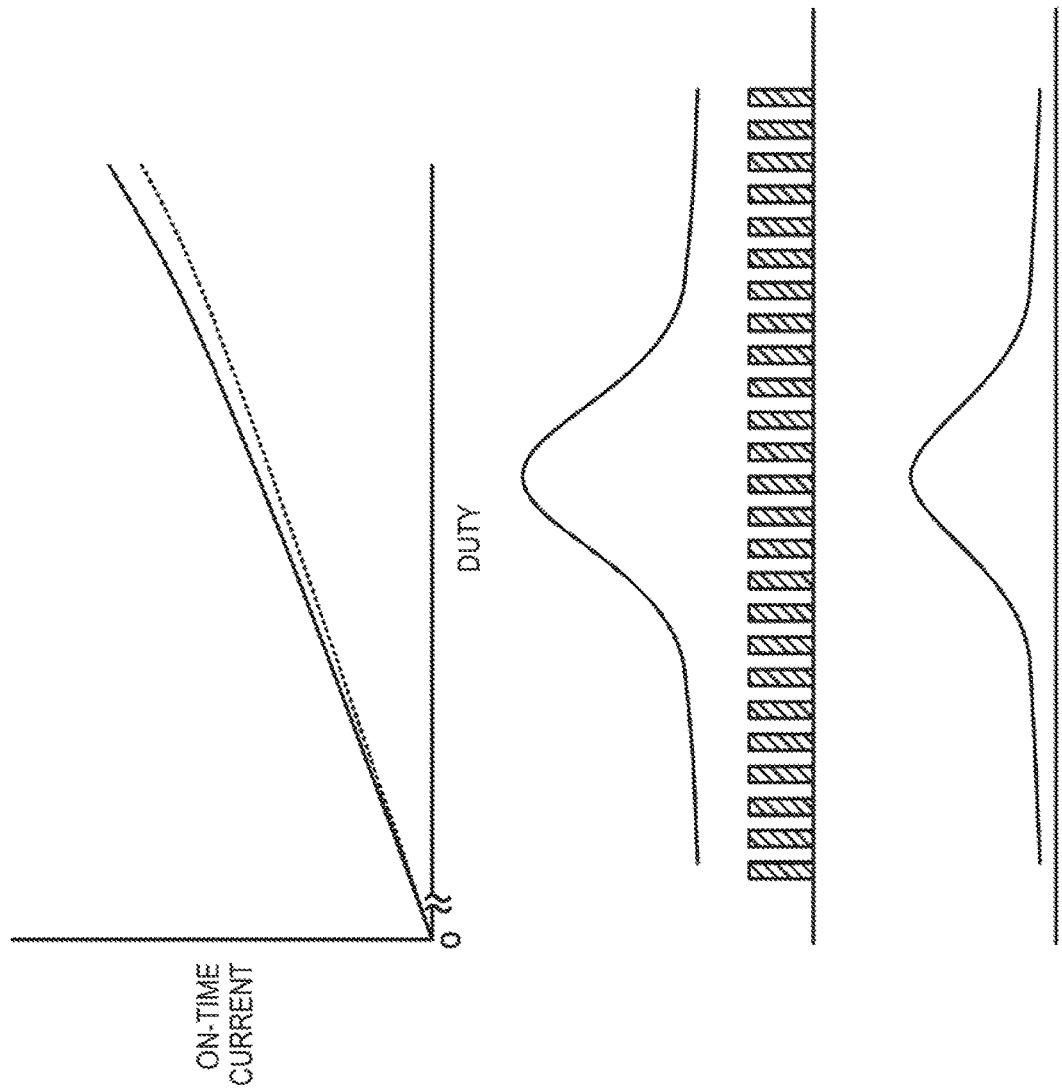

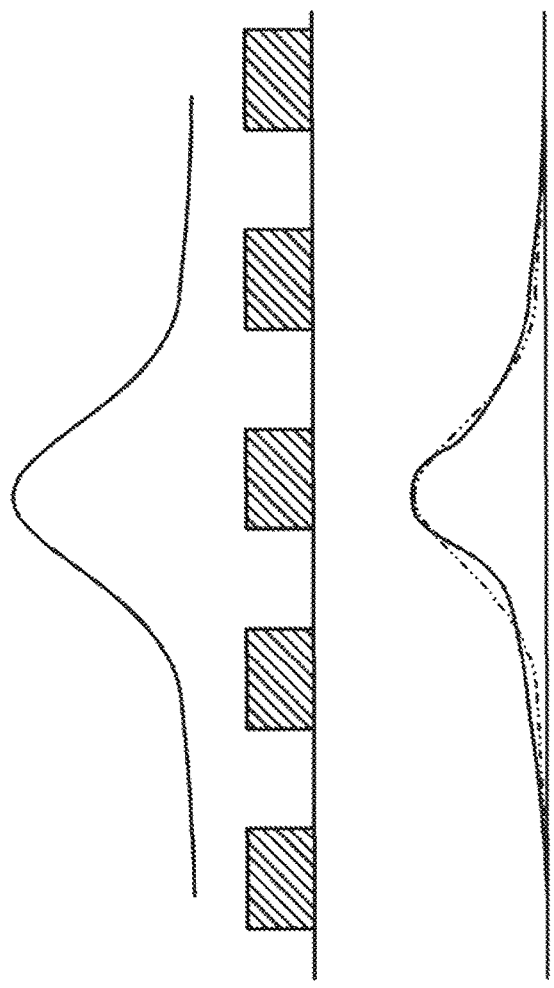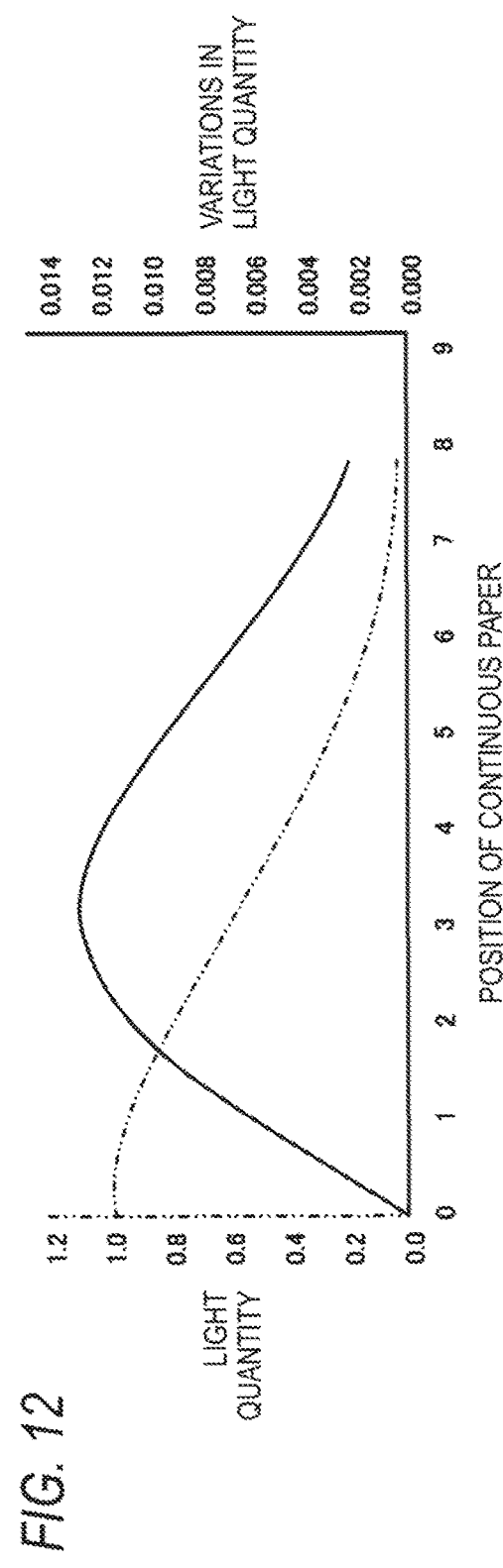
FIG. 11A
FIG. 11B
FIG. 12

LASER DRIVING CONTROL APPARATUS, DRYING APPARATUS, IMAGE FORMING APPARATUS, COMPUTER READABLE MEDIUM STORING LASER DRIVING CONTROL PROGRAM, AND COMPUTER READABLE MEDIUM STORING DRYING PROGRAM

CROSS-REFERENCE TO RELATED APPLICATIONS

This application is based on an claims priority under 35 USC 119 from Japanese Patent Application No. 2017-249850 filed on Dec. 26, 2017.

BACKGROUND

Technical Field

The present invention relates to a laser driving control apparatus, a drying apparatus, an image forming apparatus, a computer readable medium storing a laser driving control program, and a computer readable medium storing a drying program.

SUMMARY

According to an aspect of the invention, there is provided a laser driving control apparatus comprising: a driver that constant-voltage drives a laser light source that radiates laser light by supplying a pulse signal in which a plurality of pulses, each pulse width thereof being changeable, is generated at a predetermined cycle; and a controller that performs control to change the pulse width of each of the plurality of pulses of the pulse signal so that a first change amount of the pulse width fro, the pulse width before first change at a time when a present-time pulse width is changed to a preceding pulse width prior to reaching a pulse width at which a target light quantity is obtained stably is larger than a second change amount of the pulse width from the pulse width before first change at a time when the present-time pulse width is changed to a target pulse width corresponding to a driving current at an ON time of the laser light source in a steady state in which the target light quantity is obtained stably.

BRIEF DESCRIPTION OF THE DRAWINGS

Exemplary embodiments of the present invention will be described in detail based on the following figures, wherein:

FIGS. 2A and 2B are image figures showing an example of the relationship between a PWM signal and a radiation light quantity in the case that plural laser light beams is radiated, FIG. 2A showing the PWM signal, and FIG. 2B showing the light quantity of the laser light;

FIG. 9 is an image figure showing the relationship of the ON-time current of the laser light source with respect to the duty;

FIGS. 10A and 10B are image figures showing the relationship among the beam profile of the laser light, the ON/OFF duty and the radiation light quantity in the case that the ON/OFF frequency with respect to the feeding speed of continuous paper is sufficiently high, FIG. 10A showing the beam profile in the case that the laser light source is turned ON/OFF at a predetermined frequency, and FIG. 10B showing the accumulated energy profile of the light quantity of the laser light;

FIGS. 11A and 11B are image figures showing an example of a physical quantity relating to the laser light source in the case that the ON/OFF frequency with respect to the feeding speed of the continuous paper is lower than that shown in FIG. 10A, FIG. 11A showing a beam profile in the case that the laser light source is driven at a frequency lower than that shown in FIG. 10A, and FIG. 11B showing an accumulated energy;

FIG. 12 is an image figure showing the relationship between the laser light and the variations in radiation light quantity;

Figure 1:
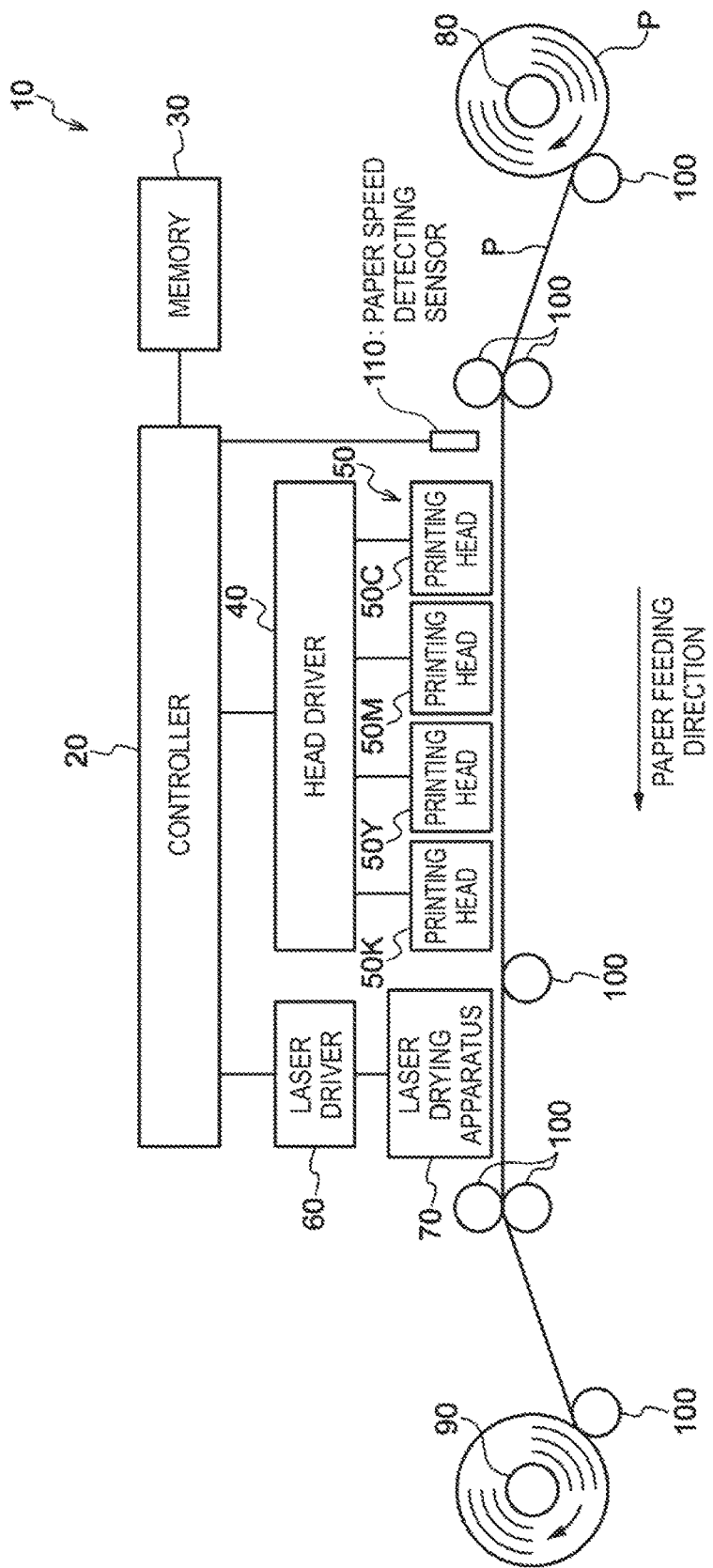
FIG. 1 is an outline block diagram showing the main configuration of an ink jet recording apparatus.

DESCRIPTION OF REFERENCE NUMERALS AND SIGNS 10 ink jet recording apparatus
20 computer
30 memory
40 head driver
50 printing head
60 laser driver
70 laser drying apparatus
201 CPU
202 ROM
203 RAM
LB laser device block
LD laser device
P continuous paper

DETAILED DESCRIPTION

An exemplary embodiment according to the disclosed technology will be described below. Components and processes having the same working and functions are designated by the same reference numerals throughout all the drawings and their overlapping descriptions are omitted as necessary in some cases.

FIG. 1 shows an example of an outline block diagram showing the main configuration of an ink jet recording apparatus 10 according to this exemplary embodiment.

The ink jet recording apparatus 10 includes, for example, a controller 20, a memory 30, a head driver 40, a printing head 50, a laser driver 60, a laser drying apparatus 70, a paper feeding roller 80, a discharging roll 90, feeding rollers 100, a paper speed detecting sensor 110.

The controller 20 drives a paper feeding motor, not shown, thereby controlling the rotation of the feeding rollers 100 connected to the paper feeding motor via a mechanism, such as gears. Long continuous paper P is wound as a recording medium around the paper feeding roller 80 in the paper feeding direction, and the continuous paper P is fed in the paper feeding direction in accordance with the rotation of the feeding rollers 100.

Furthermore, the controller 20, for example, acquires the information of an image that is desired to be drawn on the continuous paper P by the user and is stored in the memory 30, i.e., image information, and controls the head driver 40 on the basis of the color information of each pixel of the image included in the image information. After that, according to the ink drop ejecting timing instructed by the controller 20, the head driver 40 drives the printing head 50 connected to the head driver 40 and makes the printing head 50 eject ink drops, thereby forming the image corresponding to the image information on the continuous paper P to be fed.

In the color information of each pixel of the image information, information uniquely representing the color of the pixel is included. In this exemplary embodiment, it is assumed that, for example, the color information of each pixel of the image is represented by the density of the respective colors: yellow (Y), magenta (M), cyan (C) and black (K); however, it may be possible to use other representing methods for uniquely representing the colors of the image.

The printing head 50 includes four printing heads 50Y, 50M, 50C and 50K corresponding to the four colors: Y color, M color, C color and K color, respectively, and the ink ejection ports provided in the printing heads 50 for the respective colors eject ink drops corresponding to the colors. In the example shown in FIG. 1, a case in which the printing heads 50 for the respective colors are provided in the order of K color, Y color, M color and C color in the feeding direction is taken as an example. The driving method for ejecting ink drops in the printing head 50 is not limited particularly, and known methods, for example, the so-called the thermal method or the piezoelectric method, are applied.

The laser drying apparatus 70 includes a laser light source 71 equipped with plural laser devices for respectively radiating laser light onto the continuous paper P. The laser driver 60 includes switching devices, such as FETs (Field Effect Transistors), for ON/OFF controlling the respective laser devices of the laser light source 71 included in the laser drying apparatus 70. On the basis of instructions from the controller 20, the laser driver 60 drives the switching device at a predetermined frequency and adjusts the radiation light quantity of the laser light radiated from the laser device by controlling the duty of one ON/OFF cycle of the laser device. The laser driver 60 according to this exemplary embodiment performs constant voltage driving to drive the laser device and uses PWM (Pulse Width Modulation) control to ON/OFF control the laser device. More specifically, the radiation light quantity of the laser light becomes smaller as the pulse width of the signal at the ON time of the laser device becomes shorter (the duty becomes smaller), and the radiation light quantity of the laser light becomes larger as the pulse width becomes longer (the duty becomes larger) (the details will be described later).

And then, the controller 20 controls the laser driver 60, whereby the laser light is radiated onto the image forming face of the continuous paper P from the laser drying apparatus 70, and the ink drops of the image formed on the continuous paper P are dried to fix the image onto the continuous paper P. The apparatus including the laser driver 60 and the laser drying apparatus 70 is referred to as a drying apparatus. Furthermore, the image forming face is the face of the continuous paper P on which an image is formed. Moreover, the region in which an image can be formed on the continuous paper P (the image forming face) is referred to as an image forming region. In other words, the image forming region is a region in which the ink drops corresponding to the image are ejected onto the continuous paper P and an ink image can be formed.

In addition, the distance from the laser device of the laser drying apparatus 70 to the continuous paper P is set on the basis of the radiation angle and the size of the radiation region of the laser device.

After that, the continuous paper P is fed to the discharging roll 90 in accordance with the rotation of the feeding rollers 100 and is wound around the discharging roll 90.

The paper speed detecting sensor 110 is disposed, for example, at the position opposed to the image forming face of the continuous paper P and detects the feeding speed of the continuous paper P in the feeding direction thereof. The controller 20 calculates the timing in which the ink drops ejected from the printing head 50 onto the continuous paper P are fed to the inside of the laser radiation region of the laser drying apparatus 70 by using the feeding speed notified from the paper speed detecting sensor 110 and the distance from the printing head 50 to the laser drying apparatus 70. And then, the controller 20 controls the laser driver 60 so that the laser light is radiated onto the ink drops from the laser drying apparatus 70 in the timing in which the ink drops on the continuous paper P are fed to the inside of the laser radiation region of the laser drying apparatus 70.

The detection method for detecting the feeding speed of the continuous paper P at the paper speed detecting sensor 110 is not limited particularly, and known methods are applicable. Furthermore, the paper speed detecting sensor 110 is not essential to the ink jet recording apparatus 10 according to this exemplary embodiment. For example, in the case that the feeding speed of the continuous paper P has been determined beforehand, the paper speed detecting sensor 110 is not necessary in some cases.

Moreover, although aqueous ink, oil-based ink whose solvent is evaporated, ultraviolet-curable ink, etc. are available as ink, it is assumed that aqueous ink is used in this exemplary embodiment. The expression simply referred to as "ink" or "ink drops" in the following descriptions is assumed to mean "aqueous ink" or "aqueous ink drops". What's more, an IR (infrared) absorbent is added to the ink of the respective YMCK colors, except the K color, according to this exemplary embodiment, whereby the degree in which the ink absorbs laser light is adjusted; however, the IR absorbent is not necessarily required to be added to the respective YMCK colors.

As described above, the ink jet recording apparatus 10 includes the laser drying apparatus 70 to dry the ink drops ejected onto the continuous paper P.

In the case that an image is formed by using the printing head 50 that ejects ink drops, drying energy is applied to the printing region to effectively dry the printing region. A semiconductor infrared light-emitting device is attracting attention as a device for applying the drying energy to the printing region. In particular, an infrared laser serving as an example of the semiconductor infrared light-emitting device has high light emission efficiency, and the ON/OFF speed thereof can be raised. For this reason, the infrared laser is expected to be used as a device capable of performing the so-called on-demand radiation in which radiation is performed only for the demanded time.

Constant-current driving is generally used to drive a laser light source, such as a semiconductor light-emitting device. In the case that an LED (Light Emitting Diode), an example of a semiconductor light-emitting device, is used for illumination, plural LEDs is driven to obtain a predetermined illumination light quantity. In this case, since the plurality of LEDs is driven under common driving conditions, even if the LEDs have variations, since the LEDs are driven by using a common driving current, the driving voltages of the respective LEDs become close to one another, the loss in the constant current circuit is suppressed, and energy saving can be expected. However, in the case that a laser light source is used to dry ink drops and the laser light is controlled on-demand depending on the amount of ink drops, the radiation light quantity corresponds to the distribution of the ink drops. Hence, in the case that a laser light source is formed of plural laser devices and ink drops are dried by the radiation light from the laser light of the respective plurality of laser devices, since the driving current itself varies in addition to the variations of the laser devices, if an attempt is made to drive the constant current circuit by applying a common voltage, the driving voltage is set so as to correspond to the maximum driving current. For this reason, a loss occurs in the constant current circuit in which the driving current is set so as to be smaller than the maximum driving current. As a result, although image quality deterioration caused by the radiation of excessive energy onto ink drops by the on-demand control can be avoided, the effect of energy saving is reduced.

On the other hand, the radiation light quantity can be controlled accurately by PWM-controlling the laser light source that is driven with constant current. That is to say, in the PWM control, the ON-time driving current can be made constant, and the loss in the constant current circuit due to the difference in driving voltage can be suppressed; furthermore, since the average light quantity (the expression simply referred to as light quantity in the following descriptions is assumed to mean this average light quantity) in PWM one cycle is determined by the duty (Duty) of PWM, the radiation light quantity can be controlled accurately. However, since the constant current circuit individually performs negative feedback control, the number of components increases and cost becomes high. In addition, even a common current is used, if numerous laser devices connected in series are driven with a large current, since the current is large even if the variations in the driving voltage become small, the loss in the constant current circuit is not negligible. In this case, the constant current circuit is required to be cooled by using a heat sink or forced air cooling. It is thus expected that the laser light source is PWM-controlled by performing constant-voltage driving that is used to address the above-mentioned problems and to simply suppress the loss, that is to say, to reduce the number of components and to also reduce the loss. However, in the constant voltage driving, since the current at the ON-time varies depending on the variations of the laser devices and the temperatures of the laser devices, even if the duty is changed so as to correspond to the target light quantity as in the constant current circuit, the light quantity does not reach the target light quantity in some cases. For this reason, it is difficult to use constant voltage driving from efficient drying of the printing region.

Hence, in this exemplary embodiment, the laser light source 71 is controlled simply and so as to be able to suppress the loss.

FIGS. 2A and 2B show an example of the relationship between a PWM-controlled signal and a radiated light quantity in the case that a laser light source composed of plural laser devices LD radiates laser light. FIG. 2A shows the PWM-controlled signal, and FIG. 2B shows the averaged light quantity of the laser light over a cycle of PWM controlled by the signal shown in FIG. 2A. The light quantity indicates the average light quantity for one PWM cycle, unless otherwise specified.

The example shown in FIG. 2A indicates a case in which the present-time light quantity Ia is changed to the target light quantity Ib. As shown in FIG. 2A, the duty of the PWM-controlled signal for radiating the light quantity Ia is determined beforehand. In other words, the laser light source is turned ON for the time corresponding to a pulse width ta. In addition, the duty of the PWM-controlled signal for emitting the target light quantity Ib is also determined beforehand. In other words, the laser light source is turned ON for the time corresponding to the pulse width tb.

However, as shown in FIG. 2B, as the time tp when the present-time light quantity Ia is changed to the target light quantity Ib, the light quantity of the laser light emitted from the laser light source has not yet reached the target light quantity Ib. In other words, even if the duty is changed by changing the pulse width to tb so that the target light quantity Ib is radiated, the light quantity of the laser light does not reach the target light quantity Ib. It is assumed that this is because, in the case that the duty is imply changed in proportion to the target light quantity Ib, the temperature of the laser light source at the time when the change is done is the same as the temperature before the change of the duty, and the current at the time when the laser light source is turned ON remains unchanged eventually, whereby the light quantity radiated from the laser light source becomes smaller than the target light quantity. After that, the temperature rises in accordance with a predetermined time constant, and the light quantity increases eventually and converges to the target light quantity Ib. This state in which the light quantity converges to the target light quantity can be assumed to be a steady state. Consequently, for example, even if the laser light is radiated onto the paper depending on the amount of ink drops while the duty is changed in proportion to the target light quantity Ib, the light quantity does not reach the target light quantity Ib at the time when the duty is changed, and a light quantity less than the target light quantity is radiated until the light quantity converges to the target light quantity Ib.

Hence, in this exemplary embodiment, in the case that the duty is changed, the duty of the PWM-controlled signal is changed so as to compensate for the light quantity insufficient for the target light quantity; in other words, the pulse width having the predetermined time is increased or decreased.

Figures 3A, 3B:
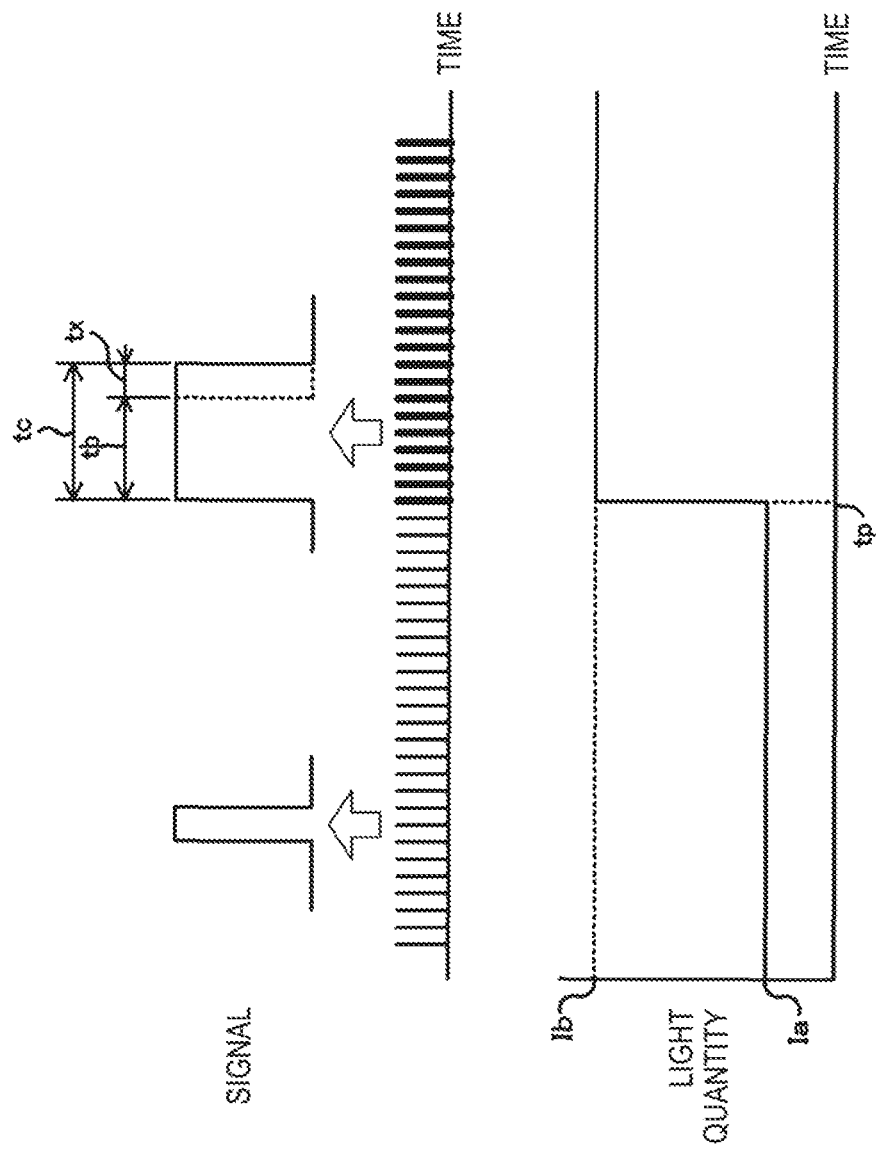
FIGS. 3A and 3B are image figures showing an example of the relationship between a PWM signal for compensating for the light quantity insufficient for the target light quantity and the radiation light quantity, FIG. 3A showing the PWM signal, and FIG. 3B showing the light quantity of the laser light.

FIGS. 3A and 3B show an example of the relationship between the PWM-controlled signal for compensating for the light quantity insufficient for the target light quantity and the radiated light quantity in the case that the duty is changed. FIG. 3A shows the PWM-controlled signal, and FIG. 3B shows the light quantity of the laser light radiated by the signal shown in FIG. 3A.

As shown in FIG. 3A, the duty is changed by changing the pulse width to a pulse width tc that is longer by time tx than the pulse-width tb during which the target light quantity Ib is assumed to be radiated in order to compensate for the light quantity insufficient for the target light quantity, whereby, as shown in FIG. 3B, at the time tp when the light quantity is changed from the present-time light quantity Ia to the target light quantity Ib, the light quantity of the laser light emitted from the laser light source reaches the target light quantity Ib.

In the example shown in FIGS. 3A and 3B, the case in which the duty is changed at the time tp when the light quantity is changed from the present-time light quantity Ia to the target light quantity Ib has been described. However, as described above, the temperature of the laser light source rises in accordance with the predetermined time constant, whereby the light quantity also increases eventually and converges to the target light quantity Ib. Hence, the duty may be changed gradually until the light quantity converges to the target light quantity Ib.

Figure 4A:
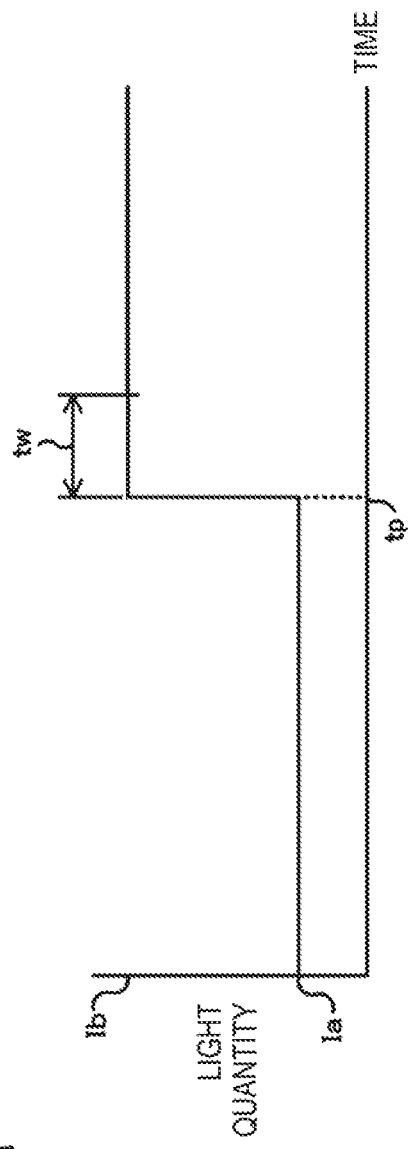
FIGS. 4A and 4B are image figures showing an example in the case that the duty is changed gradually, FIG. 4A showing the change in light quantity by the duty at which the target light quantity is assumed to be radiated, and FIG. 4B showing the case in which the duty is changed gradually.
Figure 4B:
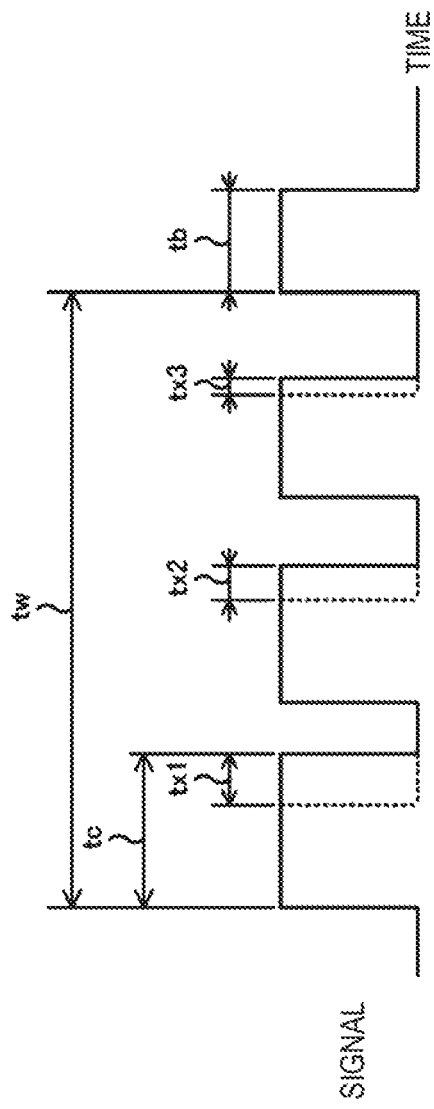

FIGS. 4A and 4B show an example in the case that the duty is changed gradually so that the duty change compensate the driving current change caused by the gradual temperature change of laser active area. This gradual changing of duty is preferable and ideal compared to the simplified method described in FIG. 3. FIG. 4A shows the abruptly changed state in light quantity in the case that the duty is changed from tc to tb gradually just after the light quantity target changed from Ia to Ib as is shown in FIG. 4B.

During the time tw, shown in FIG. 4A, that elapses until the light quantity converges to the target light quantity Ib, the duty is changed by gradually shortening the pulse-width tc that is longer by the time tx than the pulse-width tb to the pulse-width tb as shown in FIG. 4B. With this change, the light quantity radiated during the time that elapses until the time when the light quantity radiated after the time tp when the duty is changed is compensated for, and the light quantity being equal to the target light quantity Ib is radiated after the time tp.

Although the case in which the light quantity is increased from the present-time light quantity Ia to the target light quantity Ib has been described above, the disclosed technology also functions similarly in a case in which the light quantity is decreased.

Figure 5A:
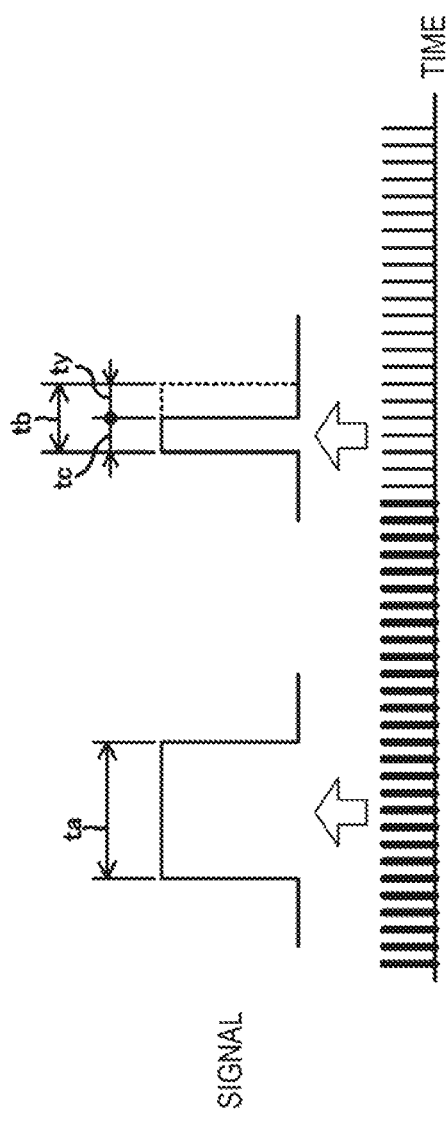
FIGS. 5A and 5B are image figures showing an example of the relationship between the PWM signal and the radiation light quantity in the case that the duty is changed to decreases the light quantity, FIG. 5A showing the PWM signal, and FIG. 5B showing the light quantity of the laser light.
Figure 5B:
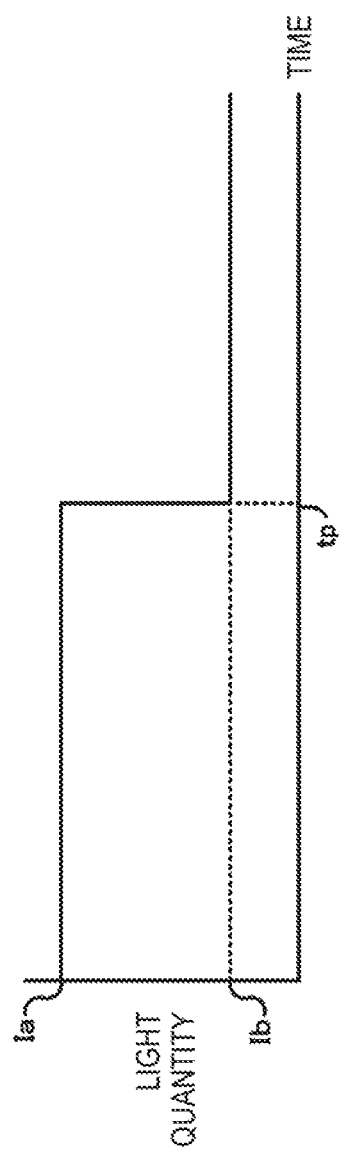

FIGS. 5A and 5B show an example of the relationship between the PWM-controlled signal and the radiated light quantity in the case that the duty is changed to decrease the light quantity. FIG. 5A shows the PWM-controlled signal, and FIG. 5B shows the light quantity of the laser light radiated by using the signal shown in FIG. 5A.

As shown in FIG. 5A, the duty is changed by changing the pulse width to the pulse-width tc that is shorter by time ty than the pulse-width tb during which the target light quantity Ib is assumed to be radiated, whereby, as shown in FIG. 5B, at the time tp when the light quantity is changed from the present-time light quantity Ia to the target light quantity Ib, the light quantity of the laser light emitted from the laser light source reaches the target light quantity Ib.

Figure 6A:
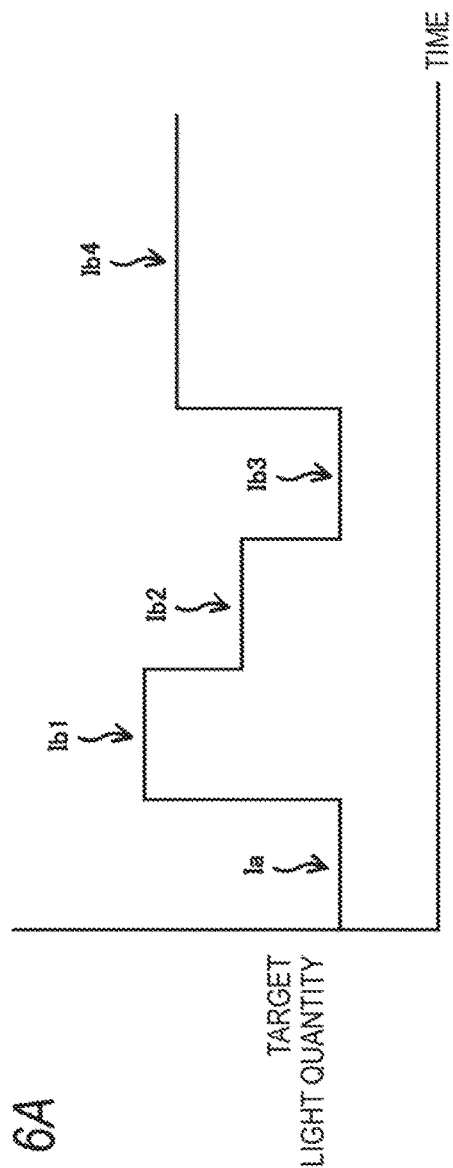
FIGS. 6A and 6B are image figures showing an example of the relationship between the target light quantity and the duty, FIG. 6A showing the target light quantity, and FIG. 6B showing the duty.
Figure 6B:
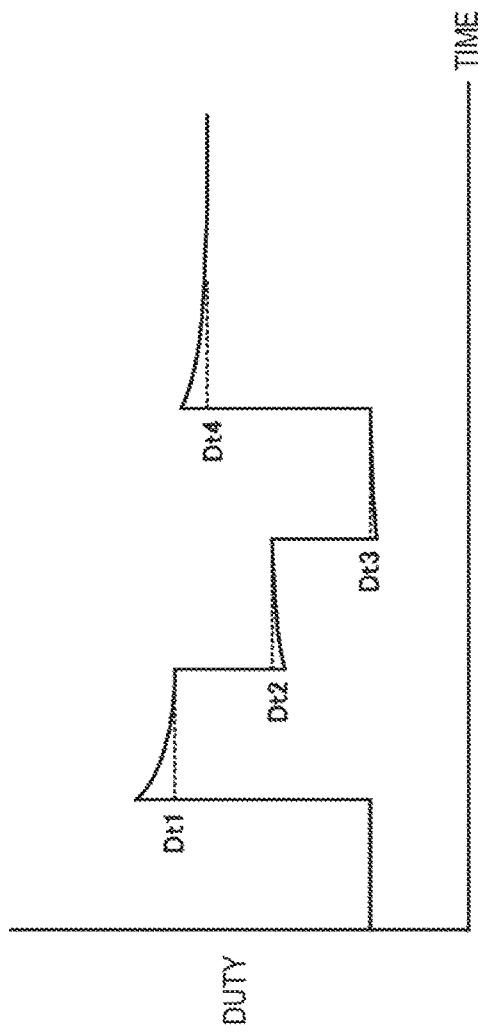

FIGS. 6A and 6B show an example of the relationship between the target light quantity and the duty for making the light quantity reach the target light quantity. FIG. 6A indicates the target light quantity, and FIG. 6B indicates the duty for making the light quantity reach the target light quantity.

As shown in FIG. 6A, in the case that the target light quantity is changed sequentially in the order of Ib1, Ib2, Ib3 and Ib4, the light quantity of the laser light radiated from the laser light source 71 reached the respective target light quantities Ib1 to Ib4 by making the duties to be changed larger than the respective duties Dt1, Dt2, Dt3 and Dt4 in accordance with which the respective target light quantities Ib1 to Ib4 are radiated as shown in FIG. 6B. In FIG. 6B, the duty to be changed is made larger than the duty that is changed actually. Since the duty that is changed actually is proportional to the amount of the change, the duty is changed to a value corresponding to the amount of the change.

In the case that the duty is changed to compensate for the light quantity insufficient for the target light quantity, it is preferable that the duty should be changed (the pulse width is increased or decreased) on the basis of the temperature characteristics of the laser light source and the laser driver 60. This is because the time until the light quantity converges to the target light quantity Ib is predicted to change depending on the temperature characteristics (temperature time constants) of the laser light source and the laser driver 60.

Figure 7:
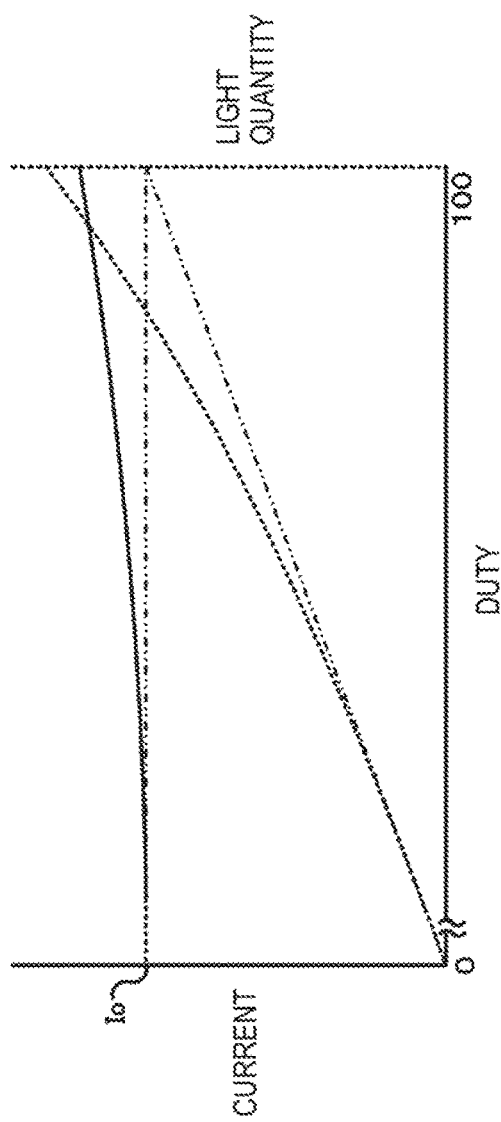
FIG. 7 is an image figure showing an example of the relationship between the driving current of the laser light source and the duty in the case that the laser light source is constant-current driven and in the case that the laser light source is constant-voltage driven.

Next, an example of a method for accurately controlling the light quantity to the target light quantity Ib will further be described. First, the relationship between the driving current of the laser light source 71 and the duty by PWM control will be described. FIG. 7 shows an example of the relationship between the driving current of the laser light source 71 and the duty by PWM control. FIG. 7 shows the relationship between the current and the radiated light quantity at the ON time of the laser light source 71 in the case that the duty is changed.

As shown in FIG. 7, since the laser light source 71 is driven by constant voltage, when the duty is increased, the current at the ON time also increases. However, the light quantity is not proportional to the duty.

Figure 8:
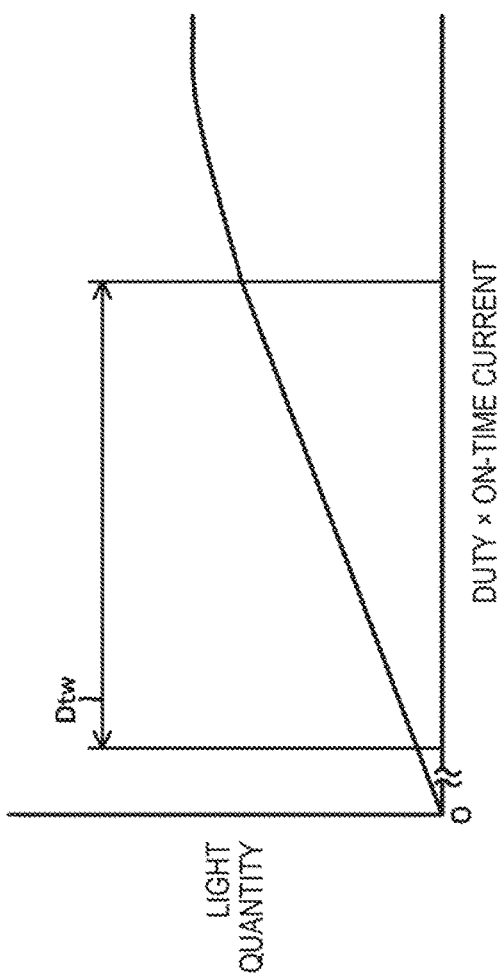
FIG. 8 is an image figure showing the light quantity with respect to the duty and the light quantity with respect to the current and the duty.

FIG. 8 shows the light quantity with respect to the result obtained by multiplying a current value obtained by subtracting the laser oscillation threshold current Ith from the driving current of the laser light source 71 and the duty.

In FIG. 8, as shown in FIG. 7, the light quantity is not proportional with respect to the duty that is PWM-controlled by constant-voltage driving. This is because, unlike the case in which PWM control is performed by constant current, the temperature of the active layer of the laser device in the laser light source 71 rises when the duty increases, the voltage characteristics and the current characteristics are changed, and the current increases, whereby the ratio of the increase due to the increase in current becomes larger than the ratio of the increase due to the proportion. On the other hand, in the light quantity with respect to the result obtained by the multiplication of the current and the duty in FIG. 8, an approximate coincidence is obtained up to the halfway of the duty. Hence, for the purpose of accurately controlling the light quantity, it is understood that it is important to grasp the current at the ON time of the PWM-controlled laser light source 71.

The cause that the duty is not proportional to the light quantity as described above is assumed to be the fact that, even if the driving voltage is constant, the current changes depending on the temperature of the active layer of the laser device. Hence, when the duty is increased, the temperature of the active layers rises, and the current increases accordingly, whereby the increase in the light quantity due to the increase in current by the temperature change of active layer of the laser device. Furthermore, when the duty is increased, the laser device enters the rollover region, whereby the light emission efficiency lowers, and the light quantity becomes lower than that in the case of the proportion. However, since the efficiency lowers in the rollover region, the rollover region should not be used essentially, and calculations become complicated when correction including the case of the rollover is assumed to be performed, whereby the rollover region is excluded from an object to be corrected in this exemplary embodiment. In other words, this exemplary embodiment is intended to make possible the control equivalent to that of the constant current circuit by using a circuit having a smaller loss and a simpler structure than the case in which the constant current circuit is used. Hence, in this exemplary embodiment, control is performed within a range Dtw in which the light quantity is assumed to be proportional to the current value obtained by subtracting the laser oscillation threshold current from the driving current.

The ON current of the laser light source 71 can be calculated from the following formula.

When it is assumed that the current at the ON time is proportional to the temperature in the vicinity of the operation point, $$In = I0 + \Delta I/\Delta T \times (Tn - To)$$

wherein To is room temperature, and Tn is the temperature of the active layer of the laser when the laser light source is driven.

In the above-mentioned formula, the temperature of the active layer of the laser is included in the formula to calculate the current when the laser light source 71 is ON. Since it is difficult to measure the temperature of the active layer of the laser in the state in which the laser light source 71 is operated, parameters including variations are obtained by performing, for example, calibrations using a thermal equivalent circuit or the like beforehand, and the temperature of the active layers is estimated by using the obtained parameters, the ON current is calculated from the temperature, and the duty is calculated from the current and the target light quantity.

Moreover, in the case that the laser light source 71 is driven, the current becomes different depending on the number of the plural laser devices being driven in the laser light source 71.

FIG. 9 shows the relationship of the ON-time current of the laser light source 71 with respect to the duty. In FIG. 9, the characteristic in the case that part of the plural laser devices included in the laser light source is driven is indicated by a solid line, and the characteristic in the case that the plural laser devices is driven is indicated by a broken line.

As shown in FIG. 9, in the case that the plural laser devices included in the laser light source 71 is driven, the voltage drop due to respective cables and common wiring becomes large, whereby the voltage applied to the laser light source 71 lowers and the current at the ON time decreases. Hence, it is preferable to consider the total driving current for driving the laser devices and the voltage drop due to the common wiring.

The transient response current of the laser light source 71 can be represented by formula (1) shown below and serving as a recurrence formula.

$$In = In-1 + ((Io - In-1) \times (\Delta T/\Delta I)/Rth + (In \times (Vps - IcRc) - \eta \times (In - Ith) \times \text{Duty}) \times \Delta t/Cth \times \Delta I/\Delta T \quad (1)$$

wherein η is differential efficiency.

The first term of the above-mentioned formula (1) is:

$$In-1 + ((Io - In-1) \times (\Delta T/\Delta I)/Rth$$

and represents heat radiation from the laser device.

The second term of the above-mentioned formula (1) is:

$$(In \times (Vps - IcRc) - \eta \times (In - Ith) \times \text{Duty}$$

and represents heat generation of the laser device.

The next current can be predicted from the difference between the heat radiation and the heat generation by using the formula (1).

Since Io is the current at Duty=0, it is the current flowing through the laser device at room temperature; the variation ΔI of the current and the variation ΔT of the temperature are in a proportional relation, and in the case that the proportional coefficient thereof is assumed to be a constant value, the temperature rise of the laser device from room temperature is represented by (Io−In−1)×ΔT/ΔI. When In is obtained from the above-mentioned formula (1), the following formula (2) is obtained.

$$In = (In-1 + ((Io - In-1)/Rth \times \Delta T/Cth + \eta \times Ith \times \Delta T/Cth \times \Delta I/\Delta T \times \text{Duty})/((1 - (Vd - IcRc - \eta) \times \text{Duty} \times \Delta T/Cth \times \Delta I/\Delta T)) + \Delta t/Rth/Cth \quad (2)$$

Furthermore, in the above-mentioned formula (2), Io and Rth×ΔI/ΔT vary depending on the voltage Vd applied to the laser device. In the case that the change is linearly approximated, when the intercept and the inclination for Io are α1 and β1 and when the intercept and the inclination for Rth×ΔI/ΔT are α2 and β2:

$$Vd = (Vps - IcRc), Io = Vd \times \alpha 1 + \beta 1 = (Vps - IcRc) \times \alpha 1 + \beta 1,$$
$$\Delta I/\Delta T \times Rth = (Vps - IcRc) \times \alpha 2 + \beta 2$$

Moreover, $\Delta I/\Delta T$ is the ratio of the current to the temperature in the used region, Vps is the power source voltage, Rc is the resistance of the wiring from the power source to the laser light source 71 including cables, Ic is the current flowing through the power source cable, Duty is the duty of the PWM control and has a value between 0 and 1, and $\Delta t$ is a differential time.

After the current at the ON time of the PWM control is obtained from the above-mentioned formula (2), when it is assumed that In remains unchanged in the case that $\Delta T$ is the time during which the temperature of the laser device is assumed to be constant, and the duty for the target light quantity can be calculated as described below.

When it is assumed that the target light quantity is Pd and that the light emission efficiency is $\eta(\Delta P/\Delta I)$:

$$Pd=(In-Ith)\times\eta\times Duty$$

$$Duty=Pd/(In-Ith)/\eta$$

the duty can be calculated as the duty corrected as described above.

Next, the calculation of the parameters will be described.

Since In=In−1 is established in the thermal equilibrium state, the formula (1) can be represented by the next formula (3).

$$((Io-In)/\Delta I/\Delta T/Rth)\times((Vps-IcRc)\times In-\eta\times(In-Ith)\times Duty)\times\Delta t/(Cth\times\Delta T/\Delta I)=0 \quad (3)$$

When $(Cth\times\Delta t/\Delta I)/\Delta I$ is multiplied to both sides of the formula (3) and arranged, the next formula (4) representing the relationship between the duty and the current is obtained:

$$In=(Io+Duty\times\eta\times Ith\times Rth\times\Delta I/\Delta T)/(1-\Delta I/\Delta T\times Rth)\times(Vps-IcRc-\eta)\times Duty) \quad (4)$$

In the straight line representing the laser device current In with respect to this duty Duty, Io becomes an intercept at Duty=0. Furthermore, $Rth\times\Delta T/\Delta I$ is obtained as calculated as described below:

$$Rth\times\Delta T/\Delta I=(In-Io)/(Duty\times(in\times(Vps-IcRc-\eta)+\eta\times Ith)))$$

Although $Rth\times\Delta T/\Delta I$ changes depending on Duty, the calculation is made by using a value in the vicinity of Duty=1 as a representative value to simplify the formula, whereby errors are suppressed while the formula is simplified in the range of Duty 0 to 1.

Moreover, since Io changes depending on the driving voltage, when this is linearly approximated, Io can be represented as described below:

$$Io=Vd\times\alpha 1+\beta 1$$

What's more, since Rth is constant and $\Delta I/\Delta T$ changes depending on the driving voltage:

when $\Delta I/\Delta T\times Rth$ is set to $Vd\times\alpha 2+\beta 2$ and is substituted in the formula (4), the formula can be simplified to the next formula (5):

$$In=(((Vps-IcRc)\times\alpha 1+\beta 1)+Duty\times\eta\times Ith\times((Vps-IcRc)\times\alpha 2+\beta 2)))/(1-(Vps-IcRc)\times\alpha 2+\beta 2)\times(Vps-IcRc-\eta)\times Duty \quad (5)$$

Next, the calculations of the respective parameters will be described.

First, the calculation of the parameter Io in the above-mentioned formula (4) will be described.

When Io is herein calculated, the connection cable of the laser light source 71 is made short to the extent that the voltage drop thereof negligible, only one laser device is driven so that the voltage drop thereof is negligible. Still further, a measurement may be made between the anode and the cathode of each laser device so that the applied voltage can be monitored directly.

While the duty is changed, the ON-time current of the PWM-controlled laser device is plotted, and the point extrapolated up to duty zero becomes Io. In this case, the measurement is made in the state in which the variations in the applied voltage are negligible even if the duty is changed.

Next, the calculation of the parameter $(Rth\times\Delta I/\Delta T)$ will be described.

When the above-mentioned formula (4) is deformed, the parameter $(Rth\times\Delta I/\Delta T)$ can be represented by the next formula:

$$Rth\times\Delta I/\Delta T=(In\ Io)/((In\times(Vps-IcRc-\eta)+\eta\times Ith)\times Duty)$$

When it is herein assumed that Rc of the cable is negligible, the following formula is obtained:

$$Rth\times\Delta I/\Delta T=(In-Io)/((In\times(Vps-\eta)+\eta\times Ith)\times Duty)$$

Next, the parameter $(Rth\times\Delta I/\Delta T)$ is calculated by substituting Io obtained as described above. A predetermined value in a region in which the light emission efficiency $\eta$ is constant, such as the maximum value, is used as the duty to be calculated. Calculations are performed by using this process for plural Vps values, and $Rth\times\Delta I/\Delta T$ is approximated as the function of Vd, and then $\alpha 2$ and $\beta 2$ of:

$$Rth\times\Delta I/\Delta T=\alpha 2\times Vd+\beta 2$$

are calculated.

Next, the time constant relating to heat is obtained by using the formula (1) including transient response.

The time constant is obtained by using the first term of the formula (1) including the transient response. In other words, the first term can be represented by a parameter separation type as described below:

$$In-In-1=((Io-In-1)/Rth\times\Delta t/Cth$$

$$\Delta T/((Io-In-1)=\Delta t(Rth\times/Cth)$$

Since $I=A\times\exp(t/(Rth\times Cth)+B$, the time constant $\tau=Rth\times Cth$ can be obtained.

The time constant $\tau$ can be obtained easily by observing the laser driving current In at the time when the duty Duty is changed because the convergence from In in the initial state to In in the thermal equilibrium state is observed. For this reason, since thermal time constant information, $Rth\times\Delta I/\Delta T$ and $Rth\times Cth$, can be obtained according to the above-mentioned descriptions without obtaining Rth that is difficult to obtain actually, another piece of thermal time constant information, $Cth\times\Delta I/\Delta T$, can also be obtained. As a result, since the formula (2) representing the transitional state can be calculated, the current of the laser device is obtained without explicitly obtaining the actual temperature T; furthermore, when the target light quantity is set, the duty Duty can be calculated.

In the case that the time constant is obtained by actual measurement, the time constant of the current change at the ON time of the laser light source 71 in the PWM control in which the value of the duty is changed in a rectangular form with time is obtained. The time constant $Cth\times\Delta T/\Delta I$ is calculated from:

$$Cth\times\Delta T/\Delta I=\tau/(Rth\times\Delta I/\Delta T)$$

by using the obtained time constant. The predetermined time $\Delta T$ is set so as to be sufficiently shorter than this time constant. If the predetermined time is set close to the time constant, errors increase in the case that the calculation is repeated.

Next, the frequency according to which the PWM control is performed will be described.

In the case that an image formed by ink drops so as to correspond to image information on the continuous paper P to be fed is dried while controlling the duty of one ON/OFF cycle of the laser light source 71, if the ON/OFF switching frequency of the laser light source 71 by the PWM control is a low frequency with respect to the feeding speed of the continuous paper, the accuracy of light quantity control may be affected in some cases.

FIGS. 10A and 10B show the relationship among the beam profile of the laser light radiated from the laser light source 71, the duty for ON/OFF switching the laser light source 71 and the light quantity to be radiated onto the continuous paper P.

FIG. 10A shows the beam profile of the laser light in the case that the laser light source 71 is turned ON/OFF at a predetermined frequency and also shows the ON/OFF signal for the PWM control. Furthermore, FIG. 10B shows the accumulated energy profile of the light quantity of the laser light radiated onto the continuous paper P in the case that the laser light source 71 is turned ON/OFF at the frequency shown in FIG. 10A. FIG. 11A shows the beam profile of the laser light in the case that the laser light source 71 is turned ON/OFF at a frequency lower than the frequency shown in FIG. 10A. Moreover, FIG. 11B shows the accumulated energy profile of the light quantity of the laser light radiated onto the continuous paper P in the case that the laser light source 71 is turned ON/OFF at the frequency shown in FIG. 11A.

As shown in FIG. 10A, when the PWM frequency is sufficiently high with respect to the movement amount of the continuous paper P in the PWM control for controlling the duty of one ON/OFF cycle of the laser light source 71, in the case that the beam profile of the laser light source 71 is sufficiently spread with respect to the movement amount of the continuous paper P for one cycle, the variations in the accumulated energy profile are small. In other words, in the case that the variation amount of the laser light to be radiated is small with respect to the movement amount of the continuous paper P for one cycle, even if the duty of one ON/OFF cycle of the laser light source 71 is changed, the error of the accumulated energy profile by the light radiated onto the continuous paper P is small.

On the other hand, as shown in FIG. 11A, when the PWM frequency for controlling the duty is low with respect to the movement amount of the continuous paper P, in the case that the beam profile of the laser light source 71 varies significantly with respect to the movement amount of the continuous paper P for one cycle, the accumulated energy profile varies depending on the phase of the PWM signal. In other words, in the case that the variation amount of the laser light to be radiated is large with respect to the movement amount of the continuous paper P for one cycle, when the duty is changed, an accumulate energy profile different from the accumulated energy profile that is assumed in the ON phase of the PWM control is obtained.

Hence, for the purpose of obtaining the assumed accumulated energy profile, the movement speed of the continuous paper P relates to the one ON/OFF cycle of the laser light source 71, that is, the frequency of the PWM control.

FIG. 12 shows the relationship between the laser light radiation from the laser light source 71 and the variations in the accumulated light quantity radiated. onto the continuous paper P.

FIG. 12 shows, as an example, the case in which the half angle of the diffusion angle of the laser light is 15 degrees, the distance between the laser light source 71 and the continuous paper P is 10 mm, the feeding speed of the continuous paper P is 200 m/min, the frequency is 50 kHz, and laser light is radiated onto the continuous paper P from the laser light source 71. The energy distribution of the laser light source is a Gaussian distribution in which the Gaussian radius is 4.4 mm. Furthermore, in FIG. 12, the energy distribution of the laser light is indicated by a two-dot chain line, and the distribution of the variations in the light quantity is indicated by a solid. line.

A shown in FIG. 12, in the case that the continuous paper P moves at a relative speed of 200 m/min, when the duty is controlled at a frequency of 50 kHz, the light quantity of the laser light on the continuous paper P varies by 1.3% at the position 3.3 mm away from the center of the beam in one cycle of 20 μsec (0.066 mm in terms of the movement distance of the continuous paper P). In the case that the variations in the light quantity of the laser light are allowed up to 6.5%, the frequency can be lowered to 10 kHz. For example, when the duty is 1%, the beam light quantity differs by 1.3% between the front end and the rear end of the region having a width of 0.066 mm at the position where the laser light source 71 is turned ON. Furthermore, in the case that the relative speed of the continuous paper becomes, for example, 40 m/min, the variations can be suppressed to 1.3% even at 10 kHz, the loss can be reduced by determining the PWM frequency by considering the feeding speed of the continuous paper as well as the target accuracy. Since the heating value of the transistor and the accuracy of the light quantity of the laser light are determined by the frequency as described above, the frequency of the PWM control can be determined from the control accuracy of the required accumulated energy.

Figure 13:
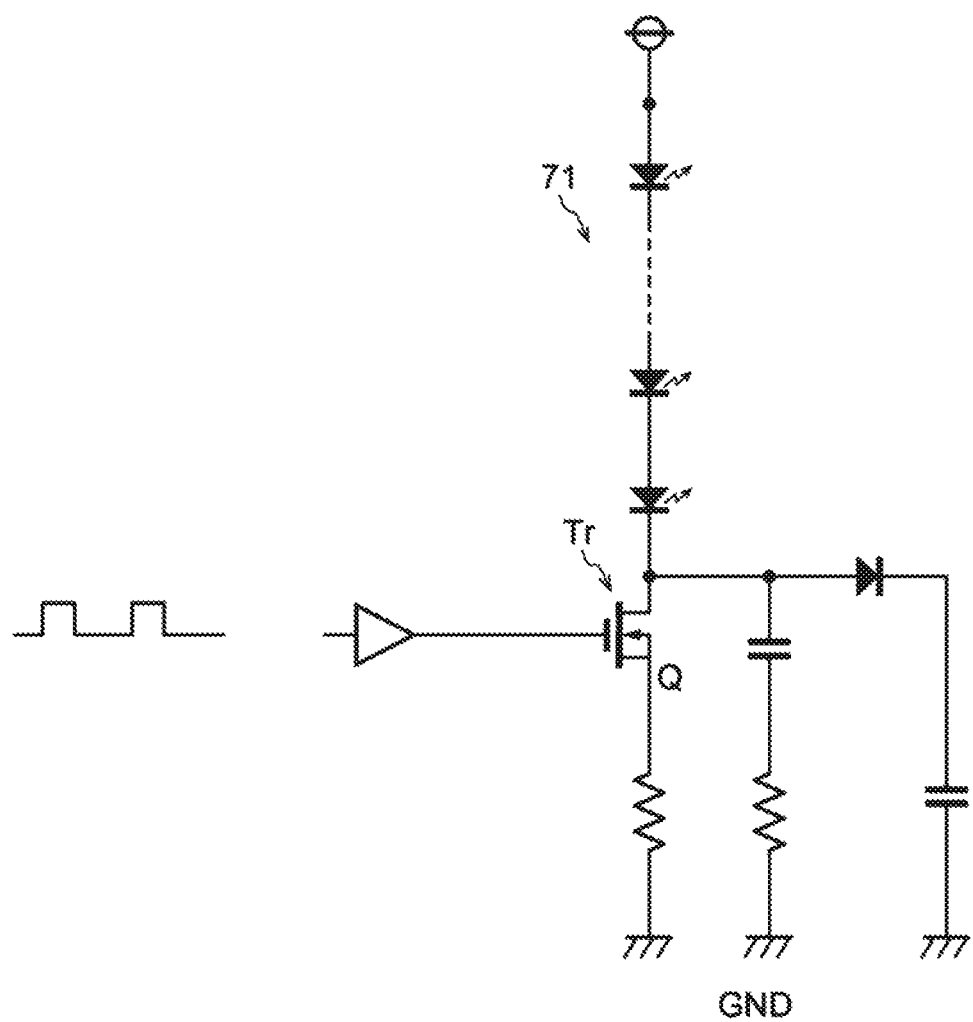
FIG. 13 is an image figure showing an example of a laser driver.

FIG. 13 shows an example of the laser driver 60.

In FIG. 13, a transistor Tr, such as an FET, is used as the switching device for turning ON/OFF the laser device at the predetermined frequency.

In the example of the laser driver 60 shown in FIG. 13, in the case that the laser driver is driven when the frequency of the PWM control based on the instructions from the controller 20 is 1 MHz and the duty is 100%, the power consumption of the transistor Tr is 60 mW.

In this case, when the duty is set to 50%, the power consumption becomes 180 mW. In the power consumption of 180 mW, 150 mW is the power consumption at the switching time and is proportional to the switching frequency. In addition, 30 mW is a DC-like loss proportional to the duty. When the transistor TR is ON, the resistance of the transistor is nearly 0 (=60 mW/current/current); and when the transistor is OFF, the resistance becomes infinite and there is no loss in terms of DC. On the other hand, when the transistor Tr is in its transient state changing from ON to OFF and to ON, even if the transition period is made short, the time for charging the gate capacitance of the switching transistor is required, and the transition period can be decreased to zero, whereby the equivalent resistor has a resistance value ranging from nearly 0 to infinity, thereby causing a loss. Hence, the loss can be suppressed by reducing the power consumption at the switching time from 150 mW to 30 mW. In other words, in the case that the laser driver is driven at 200 kHz, ⅕ of 1 MHz, or less, the generated heat is not more than the heat generated at a power consumption of 60 mW that is consumed at a duty of 100%. Consequently, the upper limit value of the frequency at which cooling is not required can be determined at a duty of 100%.

On the other hand, the lower limit value of the frequency is determined according to the movement speed of the continuous paper P, the light quantity distribution of the laser light source and the variations in the light quantity. In the example described above, it is preferable that the laser driver should be driven at a frequency of 50 kHz or more. Hence, it is preferable that the frequency of the PWM control should be set to 50 kHz or more and 200 kHz or less.

In the case that the movement speed of the continuous paper P is made variable, the frequency of the PWM control may be set depending on the movement speed of the continuous paper P.

Next, a method for deriving the duty for obtaining the target light quantity will be described specifically.

Figure 14:
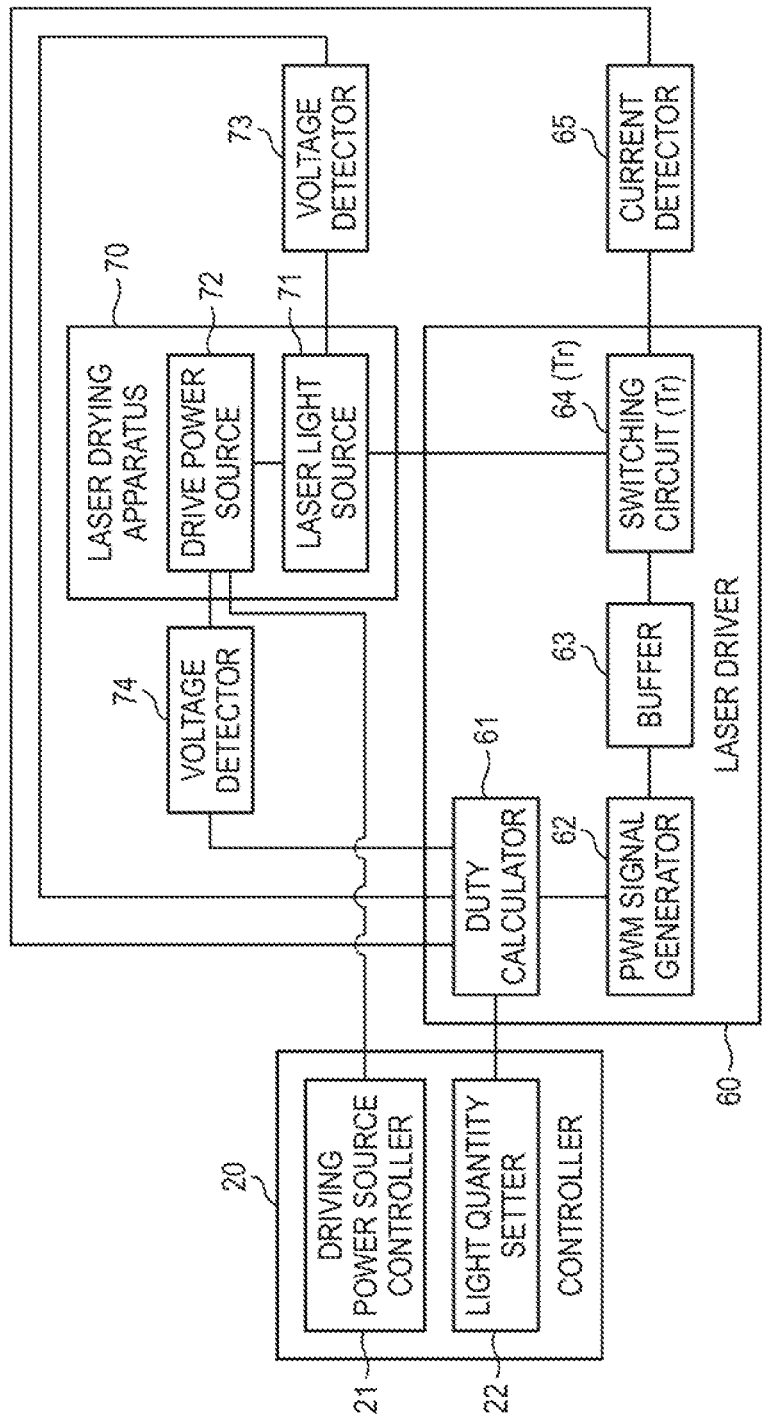
FIG. 14 is a block diagram showing an example of the main configuration of the electrical system relating to the duty.

FIG. 14 shows an example of the main configuration of the electrical system for deriving the duty for obtaining the target light quantity.

As shown in FIG. 14, the controller 20 includes a driving power source controller 21 and a light quantity setter 22. The laser driver 60 includes a duty calculator 61, a PWM signal generator 62, a buffer 63, and a switching circuit 64. The switching circuit 64 is connected to the duty calculator 61 via a current detector 65. The laser drying apparatus 70 includes a drive power source 72 and the laser light source 71, and the laser light source 71 is connected to the duty calculator 61 via a voltage detector 73. The drive power source 72 is connected to the duty calculator 61 via a voltage detector 74. Furthermore, the drive power source 72 is also connected to the driving power source controller 21.

The laser light source 71 and the switching circuit 64 are connected in series, and the positive side of the drive power source 72 is connected to the anode of the laser device and the negative side thereof is connected to the switching circuit 64. The switching circuit 64 is connected so that the PWM signal is input thereto via the buffer 63, and the laser light source 71 is PWM-driven. To the switching circuit 64, the current detector 65 for detecting the ON-time current controlled by PWM control is connected, and the voltage detector 73 for detecting the voltage between the positive side and the negative side of the laser light source 71 is connected. The measured voltage and current are used periodically or when uneven drying has occurred; while the laser devices are switched, for example, the duty is set so that the sampling time required for AD conversion is obtained securely, the voltage, current and light quantity characteristics of the laser light source 71 are measured, and the presence/absence of deterioration is judged; in the case that it is judged that deterioration is present, parameters, such as light emission efficiency, are measured again. On the other hand, at the time of ordinary driving, the voltage and current are not monitored, the duty that is set on the basis of the target light quantity is determined by calculation, and the laser light source 71 is driven at the determined duty. Accordingly, also in the on-demand control, for example, in the case that the laser light source enters a printing region again after leaving a previous printing region and starts laser radiation, when an attempt is made to measure the current and to control the light quantity according to the measured value, it is absolutely necessary to perform previous lighting and to grasp the current of the laser device at the time; this is not only wasteful but also adversely affects the image quality because unnecessary radiation is performed; similarly in the case that Duty is short, in the case that measurement can be made a the minimal duty, and expensive AD converter is required to be used; and when an AD converter having a long conversion speed is used so as to give priority on accuracy, the ON current cannot be measured in the case that Duty is short. On the other hand, in the case that the current at the time when the laser light source 71 is turned ON by PWM control is calculated at all times by the duty calculator 61, the average light quantity serving as the target light quantity is input from the controller 20 without previous lighting, the corresponding duty is calculated, and the laser light source 71 is driven at an appropriate duty.

Figure 15:
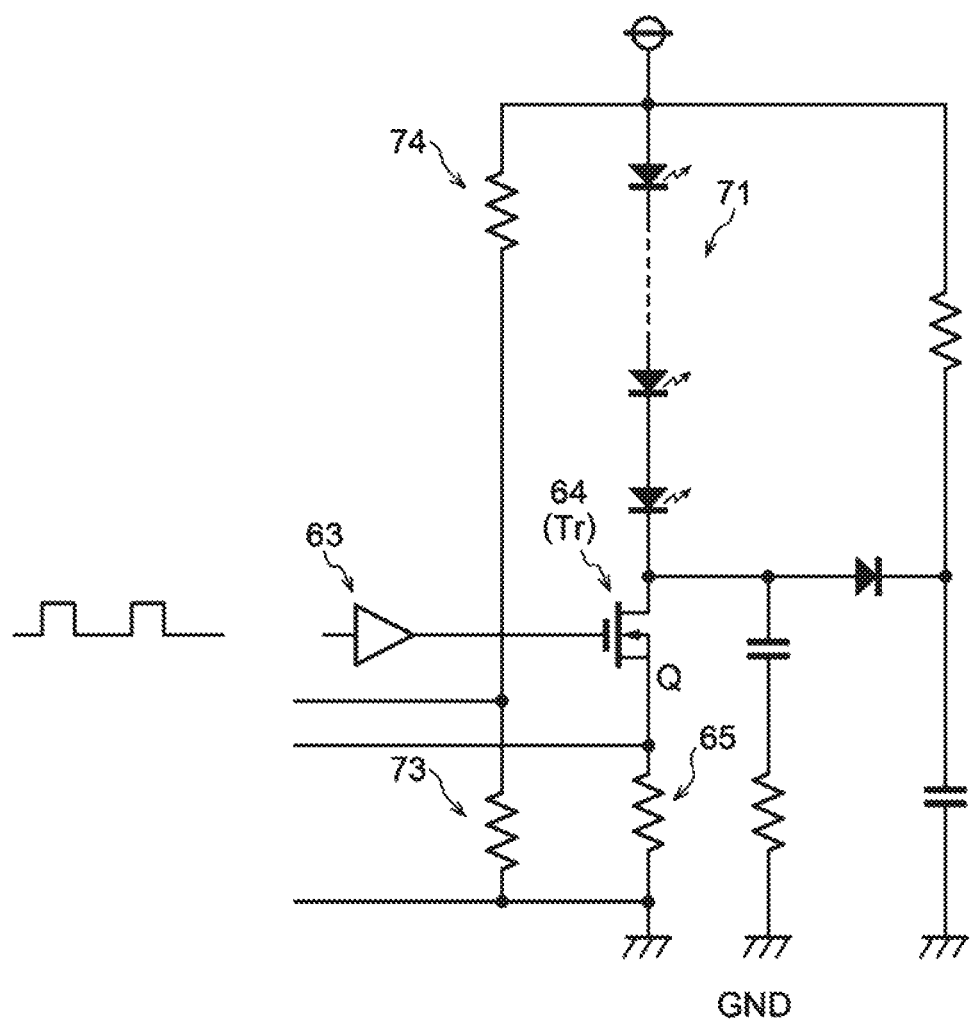
FIG. 15 is an image figures showing an example of a circuit of the main configuration of the electrical system shown in FIG. 14.

FIG. 15 shows an example of a circuit of the main configuration of the electrical system shown in FIG. 14.

As shown in FIG. 15, the switching circuit 64 is composed of, for example, an NMOS, a resistor for current measurement is connected to the source side thereof, and the drain side thereof includes a snubber circuit for preventing the breakdown of the transistor Tr constituting the switching circuit 64 and a diode and a capacitor for discharging the high voltage that is generated in the parasitic inductor included in the cable connected between the switching circuit and the power source when the transistor is turned OFF. The capacitor has been charged in advance at the anode potential of the laser device. Hence, in the case that the voltage generated at the cathode is the anode potential or less, the diode does not turn ON; only in the case that the generated voltage is more than the anode potential, the diode turns ON, whereby the voltage (charge) generated in the capacitor is absorbed.

For example, the PWM signal is configured so that the duty is changeable in increments of 1% by using clock signals of frequencies 10 kHz and 1 MHz. In the laser light source 71, for example, 20 laser devices are connected in series, and the laser light source 71 is driven at, for example, 42 V. The laser light source 71 is driven at, for example, 2 A. the resistance between the source and drain of the transistor Tr is 20 mΩ when 6 V is applied to the gate, and the loss of the transistor Tr is 80 mW at a duty of 100%.

In the switching circuit 64, voltage detection and current detection are performed for calibration. The voltage detection is used so that the voltage between the ground GND and the laser anode is divided and the voltage between both the ends becomes within a predetermined input voltage range of the AD converter. However, if the voltage between the anode and the cathode of the laser light source 71 is simply divided and input, the cathode potential at the OFF time of the switching circuit 64 rises toward the anode potential and exceeds the input voltage range of the AD converter, thereby causing breakdown. Furthermore, the current detection is performed by measuring the voltage drop at the resistor connected to the source side of the transistor Tr constituting the switching circuit 64. The resistance for the current measurement is approximately 10 mΩ, and the accuracy is ensured while the loss due to the current measurement is suppressed. In the case of 10 mΩ, even if the laser light source is driven at 2 A, the loss is 40 mW; when a current of 2 A is applied, 20 mV is output; hence, for example, in the case of a 12-bit AD converter with a full scale range of approximately 500 mV, a resolution of 1% or less can be obtained. In addition, if the driving current is large, since the potential variations at the ground GND affect the accuracy of the measurement, it is preferable that the voltage between both the ends of the resistor should be differentially input to the AD converter for both the voltage measurement and the current measurement so that the variations at the ground GND do not affect the accuracy.

Furthermore, in the case that the voltage between the ground GND and the power source terminal commonly connected to the laser devices is divided and measured for the calibration instead of detecting the voltage for each laser device, if the plural laser devices is driven simultaneously, the calculations of the parameters are affected by the voltage drop in the common wiring as described above; hence, the measurement is performed by turning ON each laser device, whereby the error due to the voltage drop in the case that the plural laser devices is driven simultaneously can be eliminated. In the case that the measurement is performed by turning ON each laser device, only one AD converter is required, and the voltage between both the ends of the resistor for both the voltage measurement and the current measurement in each of the plural laser devices may merely be switched with an analog MPX to obtain a single differential signal and then AD-converted.

Next, the process for deriving the duty for obtaining the target light quantity will be further described.

Figure 16:
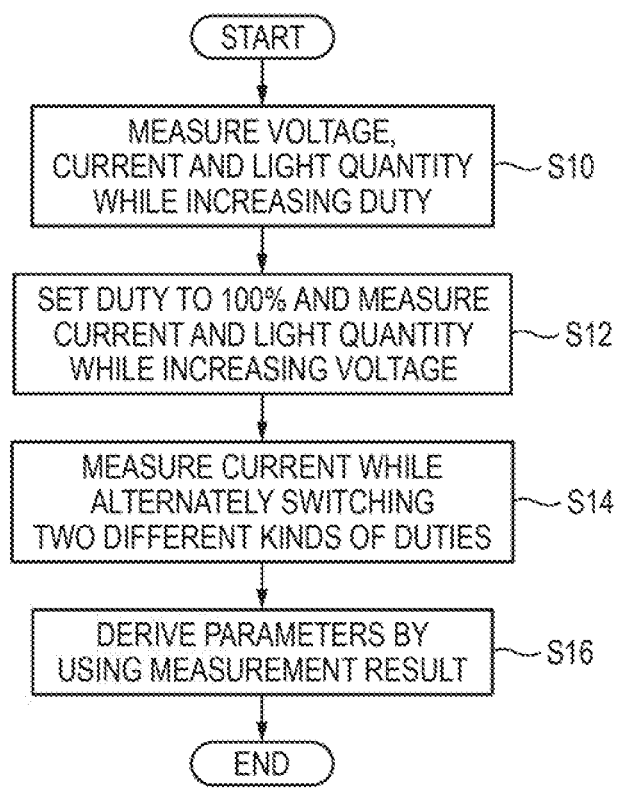
FIG. 16 is a flow chart showing an example of the flow of the process for deriving parameters for deriving the duty.

FIG. 16 shows an example of the flow of the process for deriving the parameters that are used to derive the duty for obtaining the target light quantity.

At step S10, the voltage, current, and light quantity are measured while the duty is increased. At the next step S12, the duty is set to 100% and the current and light quantity are measured while the voltage is increased. Next, at step S14, the current is measured while two different kinds of duties are switched alternately. And then, at step S16, the parameters are derived by using the measurement result.

Next, the flow of the process for deriving the duty for obtaining the target light quantity by using the parameters will be further described.

Figure 17:
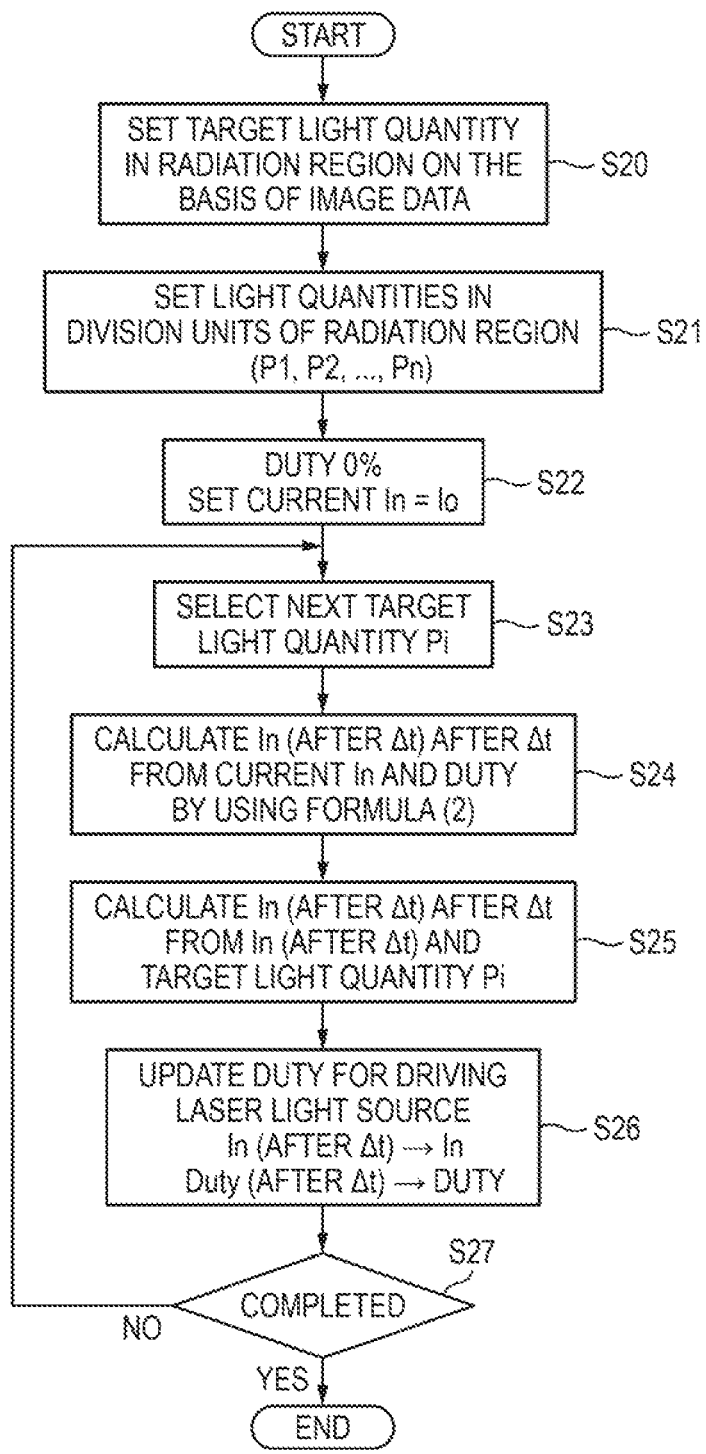
FIG. 17 is a flow chart showing an example of the flow of the process for deriving the duty.

FIG. 17 shows an example of the flow of the process for deriving the duty for obtaining the target light quantity.

At step S20, the target light quantity in the radiation region is set on the basis of image data. At the next step S21, the light quantities (P1, P2, . . . , Pn) in the division units of the radiation region are set. Next, at step S22, the setting of current In=Io is performed. At step S23, the target light quantity Pk (1<k<n) is selected, and at step S24, In is calculated by using the formula (2). At step S25, Duty is calculated from the target light quantity Pk and In. At step S26, the obtained Duty is updated at the time when the target image region reaches the radiation region. At step S27 , a confirmation is made as to whether the printer stops; in the case that the printer does not stop, the process returns to step S23, and the updating of Duty is repeated.

The configuration for performing the calculation for deriving the above-mentioned duty and generating the PWM signal can be composed of an integrated circuit incorporating a programmable logic device (PLD), such as an FPGA (Field-Programmable Gate Array). For example, in the case that the calculation circuit for deriving the duty and the generating circuit for generating the PWM signal are formed of an FPGA, the FPGA is connected to the controller 20. In this case, the controller 20 converts image density data into a radiation light quantity and outputs the radiation light quantity to the FPGA as the target light quantity. When the target light quantity is input, the FPGA derives the duty by the calculation performed in the above-mentioned process and generates PWM control signals in synchronization with the clock corresponding to the movement speed of the continuous paper P. In other words, the FPGA generates and outputs a signal with a pulse width for turning ON the laser light source and a signal for turning OFF the laser light source in accordance with the duty determined by the trigger signal generated in a predetermined PWM cycle on the basis of the internal clock for driving the FPGA.

With respect to the parameters to be used for the calculations corresponding to the individual variations of the laser light source 71, the voltage and current in the switching circuit 64 are, for example, AD-converted via the analog MPX, and the values used in the FPGA are transmitted to the controller 20. In the controller 20, the individual parameters are derived from the measurement result, and the result is output to the FPGA. The FPGA stores the individual parameters having been input, and the individual parameters are used for the next calculations.

As described above, when the laser light source 71 is constant-voltage driven, the duty by the PWM control is corrected and control is performed, whereby the light quantity to be radiated onto the continuous paper P can be controlled to the target light quantity. Hence, the light quantity to be radiated onto the continuous paper P is controlled to the target light quantity, and accumulated energy control is performed.

Next, the accumulated energy control for the laser light radiated from the laser light source 71, to be performed to dry the ink drops on the continuous paper P, will be described. The light quantity indicates the average light quantity for one PWM cycle, unless otherwise specified.

Figure 18:
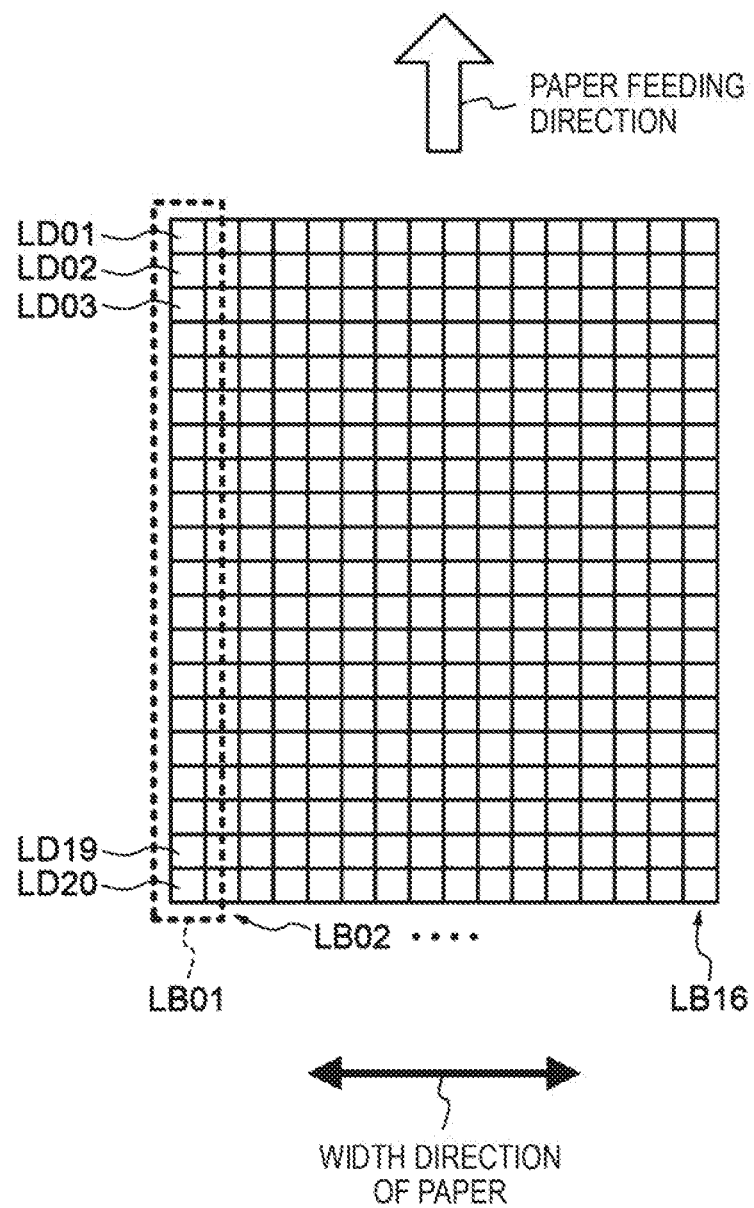
FIG. 18 is a view showing an example of the laser radiation face of a laser drying apparatus.

FIG. 18 shows an example of the laser radiation face of the laser drying apparatus 70. The laser radiation face is herein a face from which the laser light of the plural laser devices LD provided so as to be opposed to the image forming face of the continuous paper P is radiated.

As shown in FIG. 18, the plural laser devices LD is arranged in the paper feeding direction and in the width direction of the paper on the laser radiation face of the laser drying apparatus 70. The plural laser devices LD is controlled with respect to the timing of laser radiation and the radiation light quantity of the laser light by the laser driver 60. Furthermore, the plural laser devices LD is collected as laser device blocks LB, each composed of a predetermined number of laser devices in the paper feeding direction, and each laser device block LB is driven collectively by the laser driver 60. Hence, the laser device block LB functions as a group of laser devices that turn ON or OFF simultaneously.

In the example shown in FIG. 18, as an example of the plural laser devices LD, a laser device group including 20 laser devices LD01 to LD20 in the paper feeding direction is used as a laser device block LB, and 16 blocks (laser device blocks LB01 to LB16) are arranged in the width direction of the paper, whereby the laser drying apparatus 70 is composed of 320 laser devices. However, the number of the laser devices LD included in the laser device blocks LB shown in FIG. 18 and the number of blocks of the laser device blocks LB are not limited as a matter of course. Moreover, in this exemplary embodiment, a case will be described in which a laser unit is used as the plural laser devices LD; the laser unit has the laser device blocks LB arranged at intervals of 1.27 mm in the width direction of the paper.

As the laser device LD, it is preferable that a surface emission laser device for surface-emitting laser light should be used. For example, as the surface emission laser device, it is possible to use a laser device including a vertical resonator-type laser device in which plural laser devices is arranged in the paper feeding direction and in the width direction of the paper in a grid shape, the laser device being also referred to as a VCSEL (Vertical Cavity Surface Emitting Laser).

In the case that the laser device blocks LB are arranged so that the laser radiation regions of the respective laser device blocks LB above the image forming face of the continuous paper P are arranged in the width direction of the paper so as to be adjacent to each other with no clearance, the laser light of the laser radiation region unit of each laser device block LB is radiated onto the image forming face of the continuous paper P. However, the laser light having a light quantity distribution in which the light quantity gradually becomes smaller as the distance from the center increases is radiated. Hence, on the image forming face, the light quantity of the laser light varies and uneven drying of ink drops may occur sometimes.

Hence, in this exemplary embodiment, in order that a larger amount of laser light is radiated onto the image forming region at least in the width direction of the paper, the laser device blocks LB are positioned so that plural laser light beams overlaps with each other at least in the width direction of the paper. In other words, while attention is paid to the spread of the laser light radiated from the laser device LD, that is, the radiation angle and the size of the laser radiation region (on the continuous paper P) of the laser device LD, the laser devices LD are arranged so that the laser light beams of the plural laser devices at least in the width direction of the paper are radiated so as to overlap inside the image forming region in the width direction of the paper.

Figure 19:
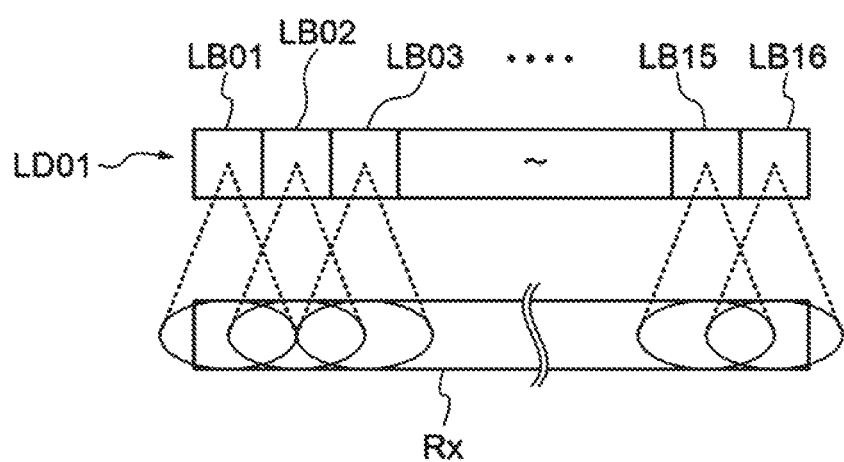
FIG. 19 is a view showing an example of the positional relationship between the image forming region and the laser device blocks in the width direction of the paper.

FIG. 19 shows an example of the positional relationship between the image forming region and the laser device blocks LB in the width direction of the paper.

In the example shown in FIG. 19, the laser device blocks LB are provided so that the laser light beams from the plural laser device blocks LB are radiated so as to overlap in the image forming region Rx in the width direction of the paper. More specifically, in consideration of the spread (radiation angle) of the laser light of the laser device LD, the distance between the laser devices LD and the continuous paper P is determined so that the laser light beams are radiated so as to overlap. With this configuration, the laser light to be radiated onto the continuous paper P can be dispersed from the laser light radiated from each laser device block to the laser light radiated from the plural laser device blocks LB. As a result, uneven drying of ink drops can be suppressed.

Furthermore, in the case that ink drops are dried by using the laser drying apparatus 70, the ink drops included in the laser radiation region of the laser drying apparatus 70 are dried. Hence, in the case that the ink drops are dried by laser radiation, it is necessary to examine how to set the laser radiation region in the laser drying apparatus 70 and how to set the light quantity of the laser light in the laser radiation region.

Figure 20:
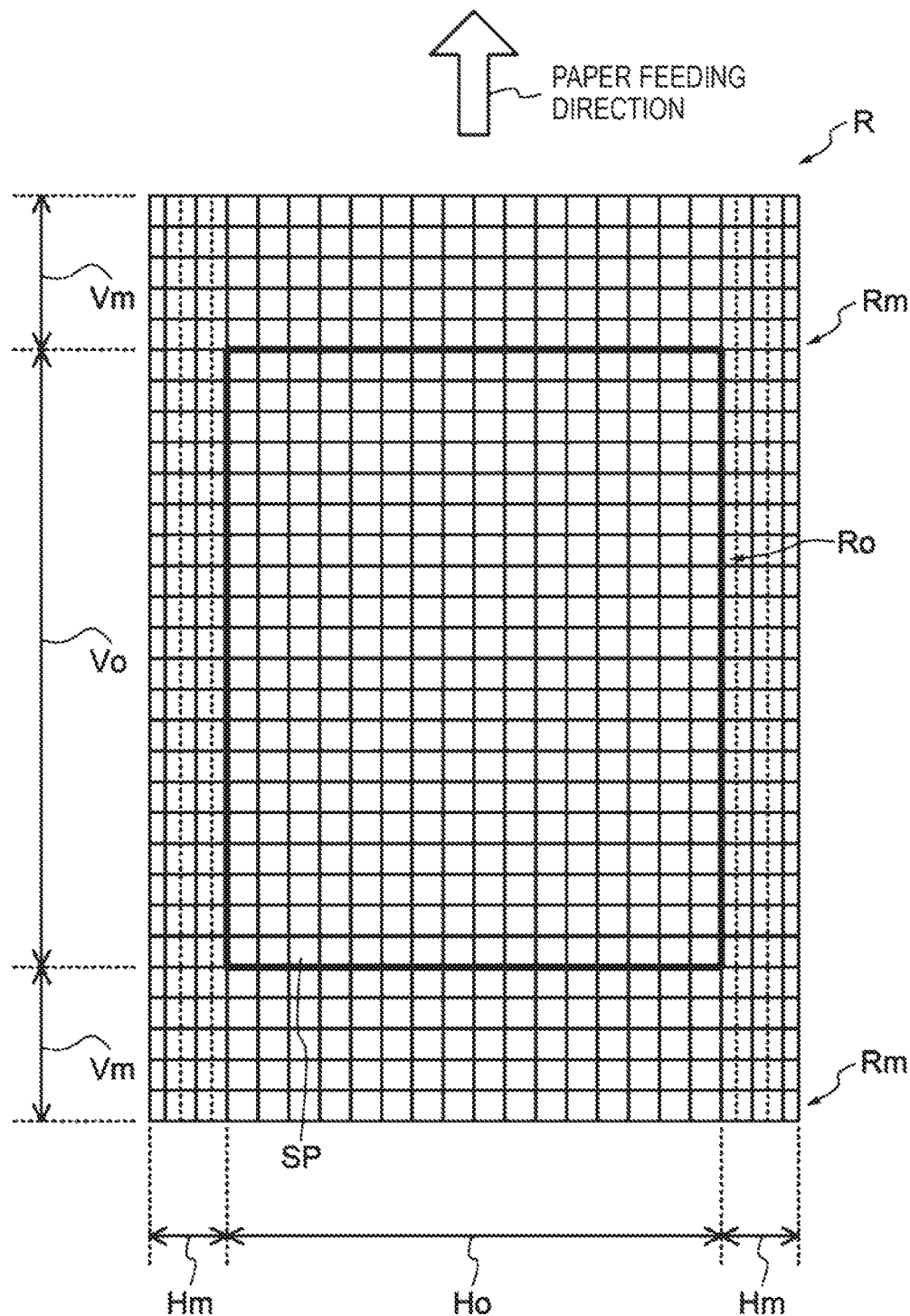
FIG. 20 is a view showing an example of the laser radiation region by plural laser devices.

FIG. 20 shows an example of the laser radiation region R composed of plural laser devices LD.

In this exemplary embodiment, the laser light beam radiated from each laser device has a spread. For the purpose of considering each laser light beam having this spread, a laser radiation region R is set; the laser radiation region R includes the region Ro corresponding to the laser radiation face composed of the plural laser devices LD and the regions Rm that have been determined to consider the laser light having the spread around the region Ro. The region Ro corresponds to the image forming region.

The region Ro is the region having the size corresponding to the laser radiation face from which the plural laser devices LD radiates laser light above the continuous paper P. In other words, in the region Ro, above the continuous paper P, the size of the width Ho corresponding to the distance in which the laser devices LD are arranged in the width direction of the paper is set, and the size of the length Vo that is extended or shrunk depending on the feeding speed of the continuous paper P is set as the distance in which the laser devices LD are arranged in the paper feeding direction. The laser light is radiated onto the continuous paper P by the plural laser devices LD while the paper is fed. Hence, the energy of the laser light radiated from the plural laser devices LD is accumulated on the continuous paper P. More specifically, for the purpose of drying the ink drops, it is important to examine the accumulated energy (the product of the radiation light quantity and the radiation time) given by the light quantity of the laser light (radiation light quantity) and the radiation time of the laser light. Furthermore, in this region Ro, regions are present in which the laser light radiated from each of the plural laser devices LD is dominant.

Hence, in this exemplary embodiment, the region Ro is divided in the unit of the laser device LD, and the accumulated energy by the laser light radiated in each unit of the division is examined. In other words, in this exemplary embodiment, the accumulated energy by the laser light is examined in the unit of the division SP that is obtained by dividing the region Ro into 16 divisions (Ho/16) in the width direction of the paper and by dividing the region Ro into 20 divisions (Vo/20) in the paper feeding direction. The size of the division SP in the width direction of the paper is set, for example, to 0.635 mm as the arrangement interval of the laser devices LD in the width direction of the paper. Furthermore, the size of the division SP in the paper feeding direction is set to 1.89 mm as the arrangement interval of the laser devices LD01 to LD20 arranged in the paper feeding direction.

In the case that the accumulated energy in the region Ro is examined in detail, the accumulated energy by the radiation light quantity of the laser light at the midpoints between the laser devices LD in the width direction of the paper is considered sometimes. In this case, the region Ro may merely be divided by the number obtained by multiplying a predetermined number to the number of the laser devices LD arranged in the width direction of the paper. For example, the accumulated energy at the valley portions of the light quantities of the laser light at the midpoints between the laser devices LD in the width direction of the paper is considered by dividing the region Ro by twice the number of the laser devices LD, whereby the uneven drying can be taken into account. Furthermore, the calculations for the regions between the arrangement intervals is made unnecessary by making the length of the division SP in the paper feeding direction equal to the arrangement interval of the laser devices LD.

On the other hand, for the purpose of considering the laser light spreading around the region R, a region Rm determines a region having predetermined divisions. In this exemplary embodiment, the region Rm determines a region having a predetermined number (for example, 5) of the divisions SP in the paper feeding direction and determines a region having a predetermined number (for example, 5) of divisions having ½ of the arrangement interval of the laser devices LD in the width direction of the paper, that is, a region having a predetermined number (for example, 5) of the divisions obtained by dividing the divisions SP into the divisions having a ½ size in the width direction of the paper. In other words, in the region Rm, on the continuous paper P, the width Hm corresponding to the distance of the arrangement of the five divisions, each have the ½ size of the division SP, in the width direction of the paper is set on each of both sides of the region Ro, and the size of the length Vm that is extended or shrunk depending on the feeding speed of the continuous paper P is set as the distance in which the five divisions SP are arranged on each of the upstream side and the downstream side in the paper feeding direction.

In this exemplary embodiment, for the purpose of avoiding errors at the calculation time of the accumulated energy, the regions Rm having a predetermined number of divisions SP on the upstream side and the downstream side in the paper feeding direction are set as objects to be examined so that the influence of the laser light leaked from the regions Rm can be considered in the case that the position to be examined on the paper is deviated from the region Vo; however, at least one of the regions Rm provided on the upstream side and the downstream side in the paper feeding direction may be ignored. The reason for this is that in the case that 20 laser devices are arranged at pitches of 1.89 mm in the paper feeding direction as shown in FIG. 18, since the degree of contribution of the leaking light to the outside of the region Vo is small, even if the region Rm is ignored, a result that the calculation result of the accumulated energy is scarcely affected has been obtained. The load of the calculation can be suppressed by ignoring the region Rm as described above.

Next, the method for driving the laser drying apparatus 70 will be described.

As described above, the laser drive 60 according to this exemplary embodiment ON/OFF drives each of the laser device blocks LB. Hence, wasteful laser radiation to the regions where there is no ink drop can be suppressed in comparison with the case in which all the laser device blocks LB included in the laser drying apparatus 70 are ON/OFF driven all together collectively. Hence, the energy consumption required for drying ink drops is suppressed, and the ink drops can be dried efficiently.

Moreover, the laser driver 60 according to this exemplary embodiment calculates the amount of the ink drops positioned on an image according to image information. In other words, the amount of the ink drops changes depending on the density of the image to be formed on the continuous paper P. Hence, the amount of the ink drops to be ejected onto a predetermined region of the continuous paper P according to the image information is calculated. In this case, the predetermined region is assumed to be a division SP.

The laser driver 60 ON/OFF drives the corresponding laser device block LB so that the laser radiation light quantity depending on the amount of the ink drops of the image is obtained. In addition, on the basis of the amount of the ink drops and the feeding speed of the continuous paper P, the laser driver 60 calculates the duty according to which the laser driver ON/OFF drive each laser device block LB. In other words, while setting the time required for the continuous paper P (the image forming region thereof) to pass through the laser radiation region R in the paper feeding direction as an accumulation time, the laser driver 60 ON/OFF drives the laser device block LB, thereby controlling the laser radiation light quantity so that the required accumulated energy is obtained depending on the amount of the ink drops of the image.

Instead of ON/OFF driving the laser device block LB depending on the amount of the ink drops of the image, the laser driver 60 may calculate the front face printing rate of the image and may ON/OFF drive the laser device block LB according to the calculated front face printing rate of the image. For example, the laser driver 60 calculates the front face printing rate of the image on the basis of image information beforehand. The printing rate is herein defined as the ratio of the places to which ink drops are actually ejected in the predetermined region of the continuous paper P with respect to the total number of places to which ink drops can be ejected. In this case, the predetermined region is assumed to be the division SP. In other words, the front face printing rate of the image is defined as the printing rate of the continuous paper P (the image forming region thereof) included in the predetermined division SP that has been determined so as to correspond to each laser device LD, when the image is formed in the image information of the continuous paper P.

The laser driver 60 ON/OFF drives the corresponding laser device block LB depending on the front face printing rate of the image so that the accumulated energy required for drying is obtained. In addition, with respect to the duty according to which the laser driver ON/OFF drives each laser device block LB, since the accumulation time during which the paper passes through the laser radiation region changes depending on the feeding speed of the continuous paper P, the laser driver determines the laser radiation light quantity by further considering the feeding speed. In other words, the laser driver 60 ON/OFF drives the laser device block LB depending on the time required for the continuous paper P (the image forming region thereof) to pass through the laser radiation region R and the front face printing rate of the image.

Next, the main configuration of the electrical system in the ink jet recording apparatus 10 will be described.

Figure 21:
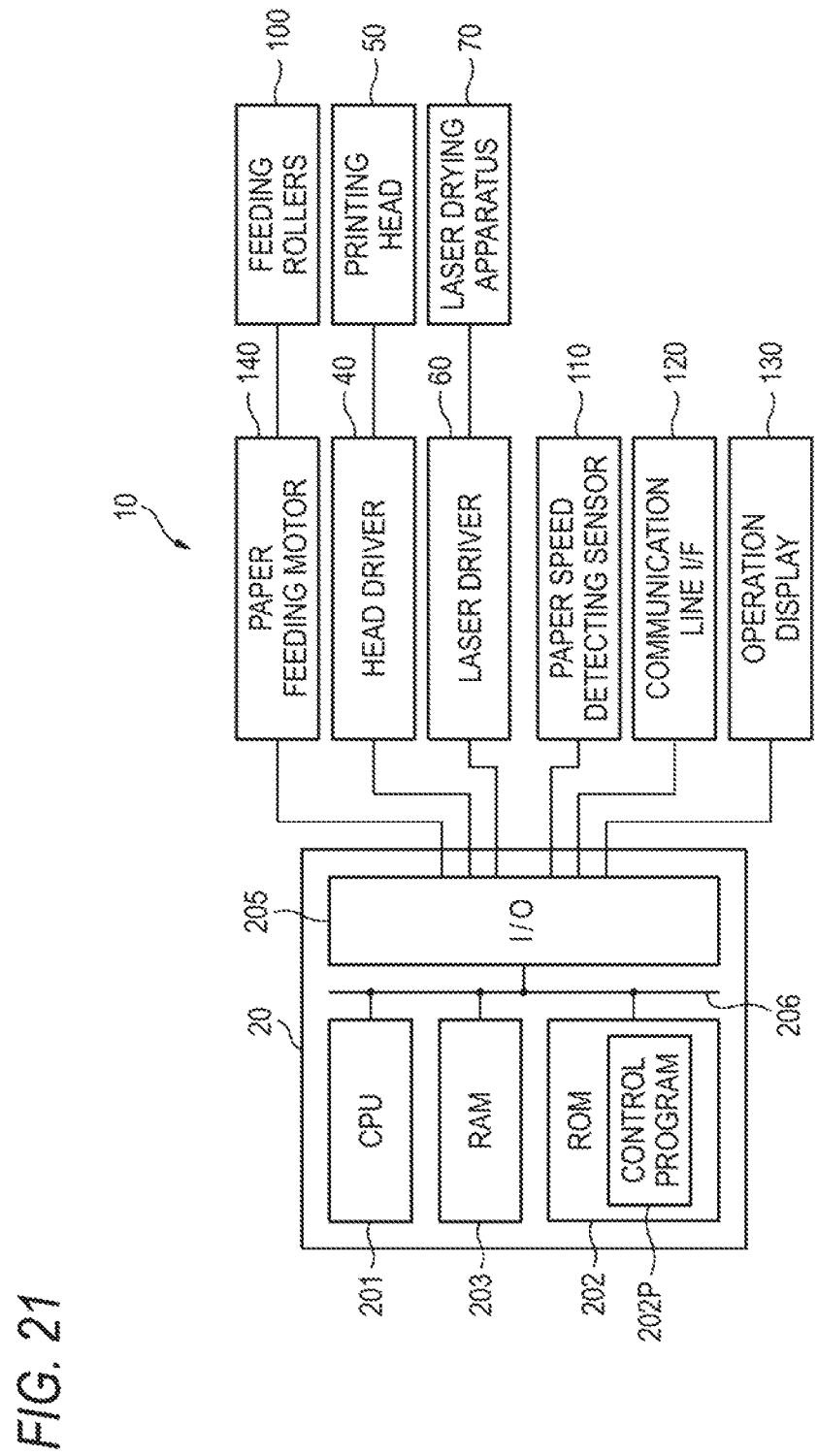
FIG. 21 is a view showing an example of the main configuration of the electrical system in the ink jet recording apparatus.

FIG. 21 is a view showing an example of the main configuration of the electrical system in the ink jet recording apparatus 10. The controller 20 can be realized by a computer. The computer that can be realized as the controller 20 is hereafter referred to as a computer 20 and described.

As shown in FIG. 21, in the computer 20, a CPU (Central Processing Unit) 201, a ROM (Read Only Memory) 202, a RAM (Random Access Memory) 203, a nonvolatile memory 204 and an input/output interface (I/O) 205 are respectively connected via a bus 206. In addition, the head driver 40, the laser driver 60, the paper speed detecting sensor 110, a communication line I/F (Interface) 120, an operation display 130 and a paper feeding motor 140 are connected to the I/O 205. Furthermore, the printing head 50 is connected to the head driver 40, and the laser drying apparatus 70 is connected to the laser driver 60. Moreover, the feeding rollers 100 are connected to the paper feeding motor 140 via a driving mechanism such as gears, and the feeding rollers 100 are rotated as the paper feeding motor 140 is driven.

The computer 20 executes, for example, the control program 202P preliminarily installed in the ROM 202 by using the CPU 201 and performs data communication with the respective components connected to the I/O 205 according to the control program 202P, thereby controlling the ink jet recording apparatus 10.

The head driver 40 includes, for example, a amplification device, such as an transistor, that is used to drive the printing head 50 on reception of an instruction from the computer 20.

The printing head 50 includes, for example, a piezoelectric element for converting the change in voltage into force, operates the piezoelectric element according to driving instructions from the head driver 40 and ejects the ink drops supplied from an ink tank, not shown, through the ejection port of the nozzle of the printing head 50 toward the continuous paper P.

The laser driver 60 includes, for example, a switching device, such as an FET for ON/OFF driving each laser device block LB included in the laser drying apparatus 70 and drives the switching device on reception of instructions from the computer 20.

The laser drying apparatus 70 includes, for example, the laser device blocks LB and radiates laser light from the laser device blocks LB toward the continuous paper P according to the drive instructions from the laser driver 60.

The communication line I/F 120 is an interface connected to a communication line, not shown, for performing data communication with an information apparatus, such as a personal computer, not shown, connected to the communication line. This communication line, not shown, may be a wired type, a wireless type or a mixture of a wired type and a wireless type and may receive image information from an information apparatus, not shown.

The operation display 130 receives instructions from the user of the ink jet recording apparatus 10 and notifies various kinds of information regarding, for example, the operation conditions of the ink jet recording apparatus 10, to the user. The operation display 130 includes, for example, a touch panel type display on which display buttons for realizing the reception of operation instructions and various kinds of information are displayed by programs and also includes hardware, such as a numeric keypad and a start button.

The processing of the ink jet recording apparatus 10 including the above-mentioned components can be realized by software using the computer 20 by executing the control program 202P.

The control program 202P is not limited to have the form preinstalled in the ROM 202 and provided but may have a form provided in the state of being stored on a computer-readable recording medium, such as a CD-ROM or a memory card. Moreover, the control program may have, for example, a form to be distributed via the communication line I/F 120.

Next, the operation of the ink jet recording apparatus 10 according to this exemplary embodiment will be described.

Figure 22:
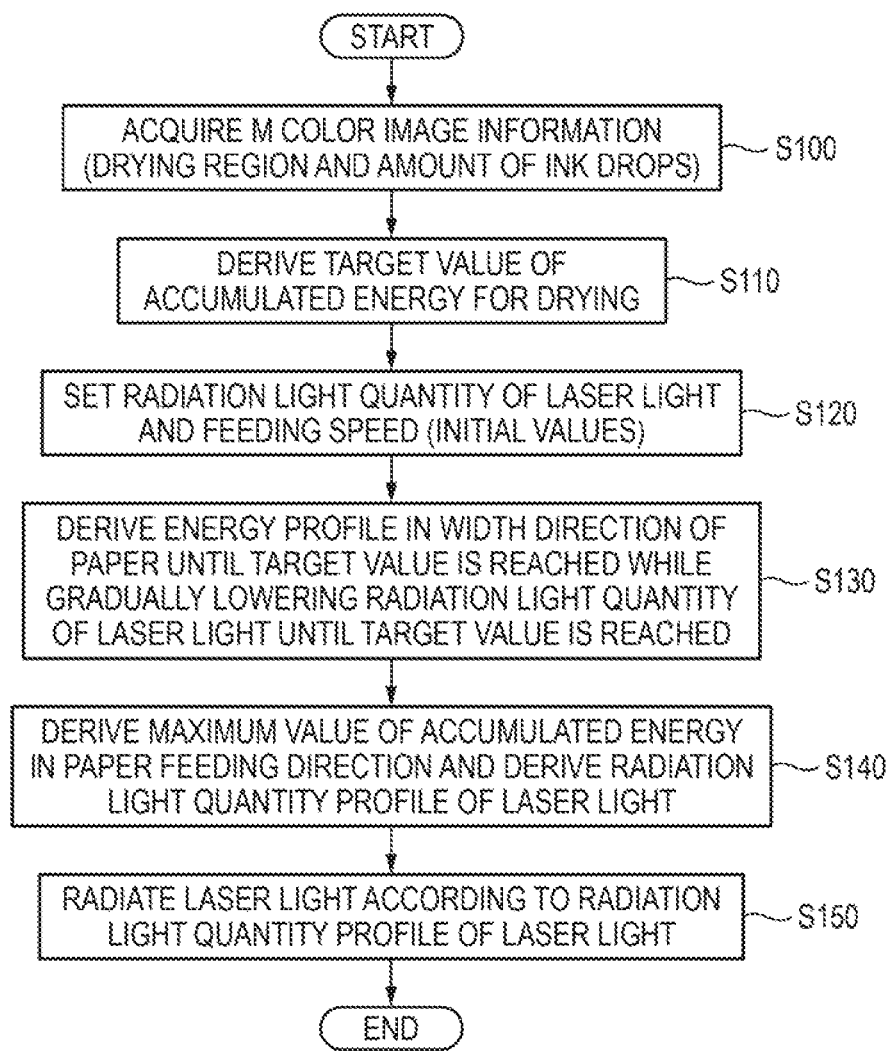
FIG. 22 is a flow chart showing an example of the flow of the drying process according to this exemplary embodiment.

FIG. 22 shows the flow of the processing of a drying program serving as an example of the control program 202P that is executed by the CPU 201 of the computer 20 at the time when image information to be formed on the continuous paper P is received from the user.

A case in which an M color ink image formed immediately ahead of the laser drying apparatus 70 is dried is herein described to simplify the description.

First, at step S100, for example, M color image information preliminarily stored in a predetermined region of the RAM 203 is acquired. For example, the M color image information includes information indicating a drying region and various kinds of information indicating the amount of ink drops. The drying region specifies the position and the size of the region where ink drops are ejected to the image forming region and an ink image is formed. Furthermore, since the amount of ink drops varies depending on the density of the image, the amount of the ink drops is determined so as to correspond to the position (for example, pixel) inside the drying region. Hence, the various kinds of information indicating the amount of the ink drops are related to the position (for example, pixel) inside the drying region.

At the next step S110, the accumulated energy for drying the M color ink image to be formed on the continuous paper P (on the image forming region) is derived by using the M color image information acquired at step S100, and the value of the derived accumulated energy is stored in the RAM 203 as a target value. For the purpose of drying the M color ink drops, it is necessary to give the energy for drying the amount of the M color ink drops according to the M color image information; in this exemplary embodiment, it is assumed to give the accumulated energy depending on the amount of the laser light (radiation light quantity) and the radiation time of the laser light.

Hence, at step S110, first, the image information is developed in the predetermined region of the RAM 203 so that the amount and place of the M color ink drops of each pixel of the image represented by the M color image information become coincident with the position of the image to be formed on the continuous paper P (on the image forming region). The image information developed in the RAM 203 is referred to as image data.

And then, the image data developed in the RAM 203 is divided into the size of the division SP corresponding to the laser device LD being used in the laser drying apparatus 70. The amount of the M color ink drops of the image data is calculated for each region corresponding to the size of the divided division SP, and the calculated amount of the M color ink drops is stored in the RAM 203 so as to correspond to each position of the division SP in the image forming region (the region Ro of the laser radiation region R).

Next, the drying energy for drying the amount of the ink drops is derived for each division SP. In other words, the amount of the ink drops corresponding to the position of each division SP is dried. The energy that is set, for example, depending on the light quantity of the laser light and the radiation time of the laser light, is derived as the drying energy for each division SP. The derived drying energy is stored in the RAM 203 as the target value of the accumulated energy for drying the amount of the ink drops included in the division SP so as to correspond to the position of each division SP.

Figure 23:
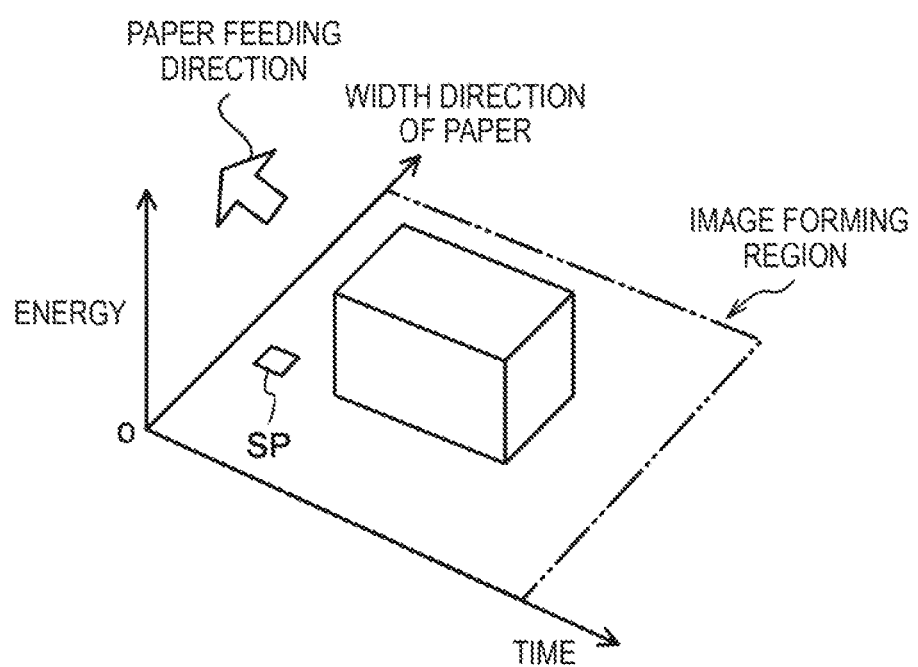
FIG. 23 is a view showing an example of the energy in the image forming region derived as the target value.

FIG. 23 shows an example of the energy in the image forming region derived as the target value.

Next, at steps S120 and S130, the laser radiation light quantity is calculated from the target value of the accumulated energy at a specific position in the paper feeding direction by performing repetitive calculations. First, at step S120, for the purpose of deriving the radiation light quantity of the laser light radiated from the laser drying apparatus 70, the initial value of the accumulated energy for the repetitive calculations is set on the basis of the maximum radiation light quantity of the laser light radiated from the laser device block LB for example at the time when the duty has the maximum value and the feeding speed for feeding of the continuous paper P in the paper feeding direction. It is herein assumed that the predetermined feeding speed according to which the continuous paper P is fed inside the ink jet recording apparatus 10 has been stored as the feeding speed.

At the next step S130, the energy profile in the width direction of the paper is derived by repeatedly calculating the radiation light quantity of the laser device LD until the target value is reached while the radiation light quantity of the laser light is gradually lowered so that the energy does not become less then the target accumulated energy. In this exemplary embodiment, when the accumulated energy for drying the M color ink image is derived, the accumulated energy is not calculated in two dimensions but is calculated in one dimension; that is to say, since the 20 laser devices are arranged in the paper feeding direction and they are controlled collectively, it is assumed that the energy in the paper feeding direction has the same value, and the energy is calculated only in the width direction of the paper, whereby the calculation is simplified significantly. The one-dimensional accumulated energy in the width direction of the paper is derived for the M color ink image and the energy profile is developed in the paper feeding direction.

Hence, at step S130, the one-dimensional accumulated energy in the width direction of the paper is derived over the paper feeding direction. More specifically, first, for a group of divisions SP composed of a series of divisions SP in the width direction of the paper in the image forming region of the continuous paper P, the accumulated energy profile in the case that the laser light having the initial value of the radiation light quantity is radiated from the laser device block LB while the continuous paper P is fed is derived. And then, the one-dimensional accumulated energy is derived over the paper feeding direction. Next, the radiation light quantity of the laser light is lowered by a predetermined radiation light quantity, and the one-dimensional accumulated energy is derived repeatedly over the paper feeding direction. In this case, the radiation light quantity of the laser device block LB corresponding to the division in which the derived one-dimensional accumulated energy (in the width direction of the paper) has become less than the target value is stopped from being lowered. And then, the value not less than the target value of the accumulated energy, just one ahead of the value less than the target value, is adopted as the radiation light quantity to be obtained.

Figure 24:
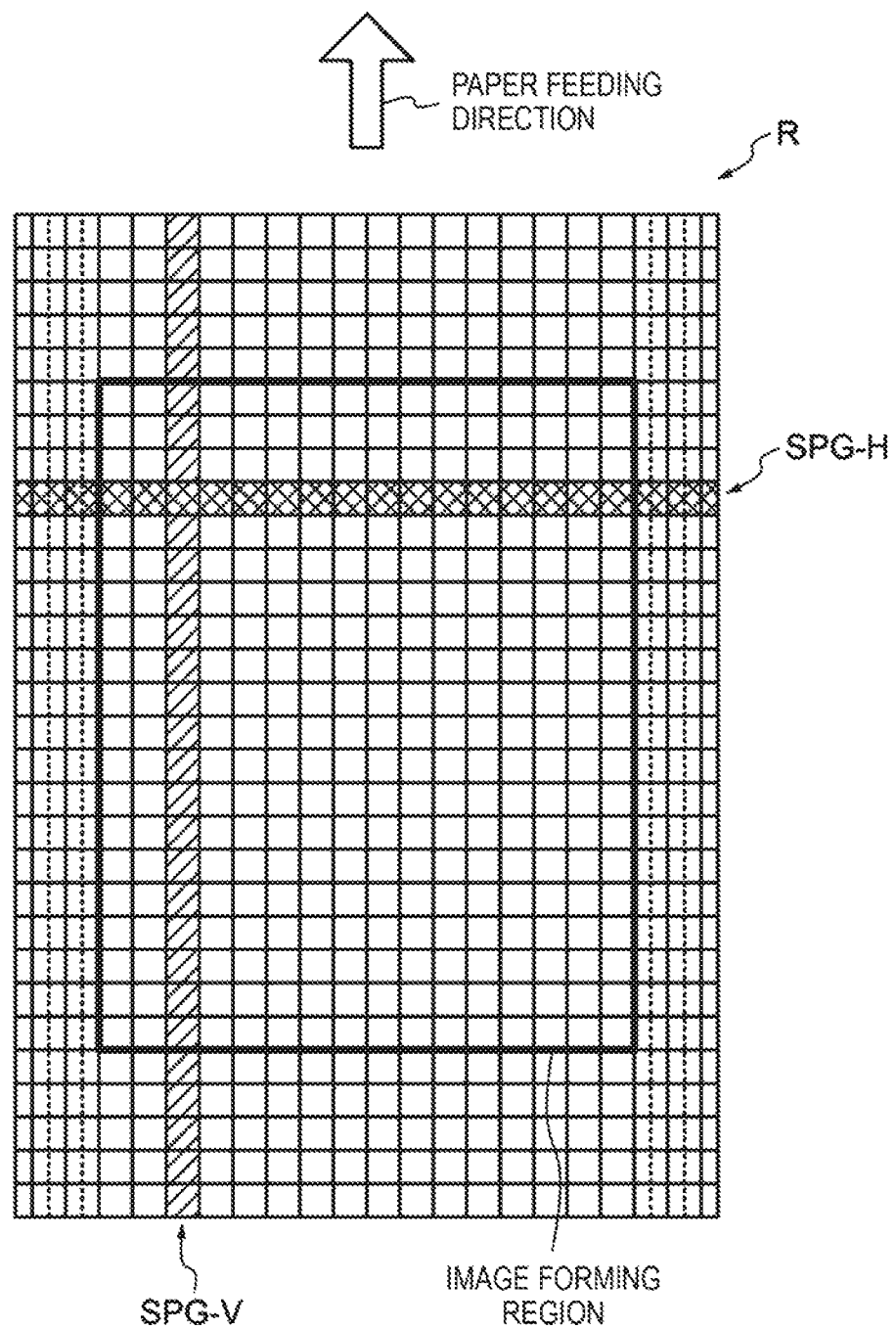
FIG. 24 is a view showing an example of a region serving as an object from which the accumulated energy is derived.

FIG. 24 shows an example of a region serving as an object from which the accumulated energy is derived in the image forming region of the continuous paper P. FIG. 24 shows an example of a division SP group SPG-H in which individual divisions SP are arranged continuously in the width direction of the paper in the image forming region of the continuous paper P in the case that the one-dimensional accumulated energy in the width direction of the paper is derived over the paper feeding direction.

Figure 25:
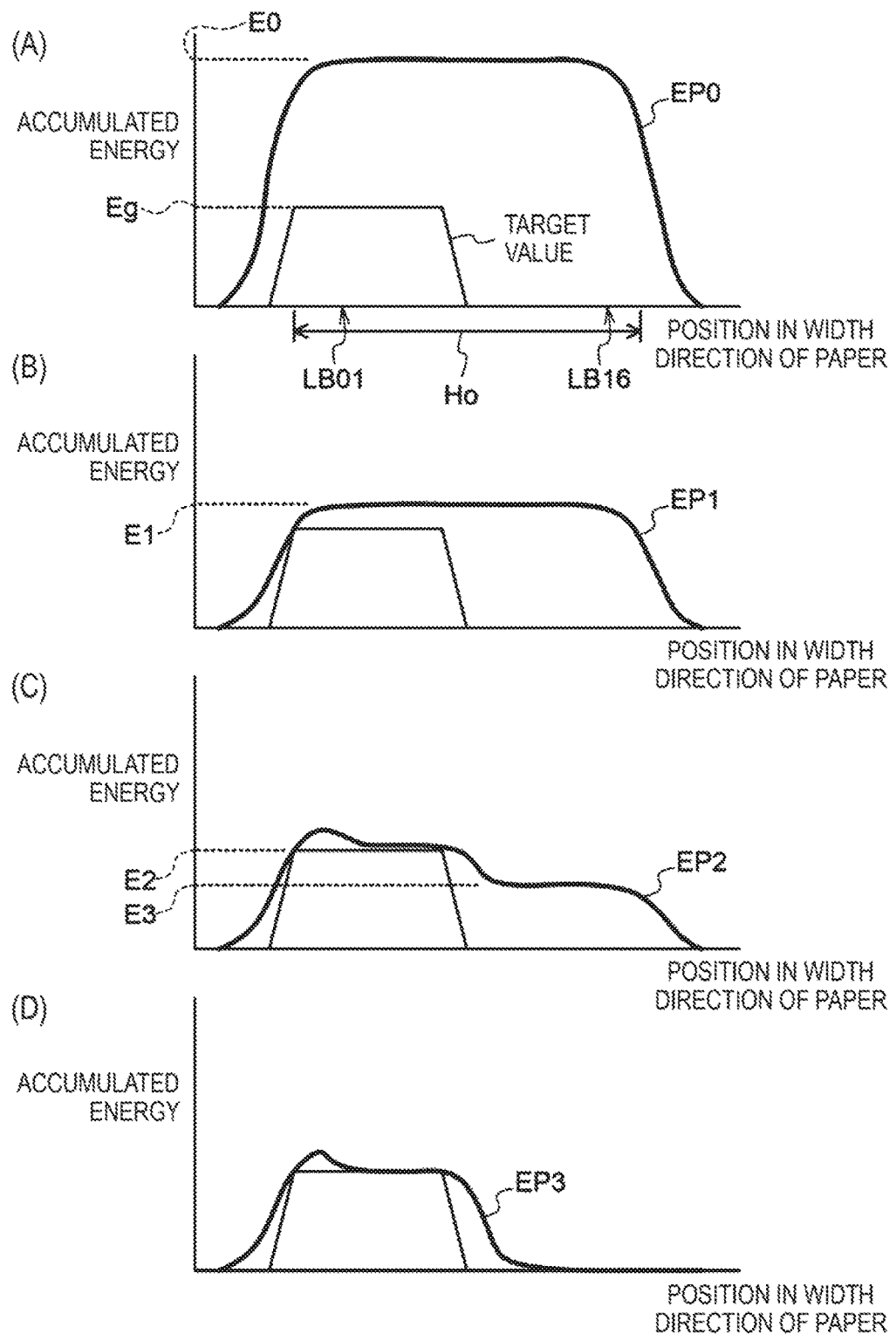
FIG. 25 is a schematic diagram showing an example of the process for obtaining the radiation light quantity of the laser device.

FIG. 25 shows an example of the process for obtaining, with regard to the division SP group SPG-H, the radiation light quantity of each laser device LD from the accumulated energy serving as the target value by performing repeated calculations.

As shown in (A) of FIG. 25, in the case that, for example, laser light is radiated from all the laser device blocks LB01 to LB16 while the radiation light quantity of each laser device LD is set to the maximum radiation light quantity as the initial value for the repetitive calculations and the continuous paper P is fed, to the division SP group SPG-H, the laser light having the maximum radiation light quantity is radiated sequentially in the length direction of the laser device blocks LB from the respective laser devices LD included in all the laser device blocks LB and arranged in the width direction of the paper. Hence, the accumulated energy in the division SP group corresponding to the width Ho, that is, in the image forming region in the width direction of the paper, becomes accumulated energy E0 in which the energy by the laser light having the maximum radiation light quantity is accumulated. In this case, an energy profile EP0 in the width direction of the paper is obtained as the distribution of the accumulated energy in the width direction of the paper in the image forming region.

Furthermore, when the energy profile EPo is compared with the target value, in the case that the accumulated energy in the width direction of the paper is the target value or more, the radiation light quantity is lowered.

In other words, as shown in (B) of FIG. 25, the radiation light quantity of each of the laser devices LD in all the laser device blocks LB01 to LB16 is lowered gradually by a predetermined radiation light quantity until the energy profile EP0 makes contact with any position of the profile formed according to the target value. In the example shown in (B) of FIG. 25, the energy profile EP1 in the width direction of the paper by the accumulated energy E1 in which the energy by the laser light having the radiation light quantity that is lowered from the maximum radiation light quantity by the predetermined radiation light quantity makes contact with the profile formed according to the target value.

Next, the radiation light quantities of the plural laser device blocks LB relating to the divisions SP corresponding to the position of the energy profile EP1 making contact with the profile formed according to the target value are stopped from being lowered, and the radiation light quantity of each laser device LD in another laser device block LB is lowered by the predetermined radiation light quantity sequentially and repeatedly.

In other words, as shown in (C) of FIG. 25, while the accumulated energy E1 by the energy profile EP1 making contact with the profile formed according to the target value is maintained, the radiation light quantity is lowered repeatedly until the accumulated energy by the other laser device block LB, the radiation light quantity of which has been lowered, makes contact with the profile formed according to the target value, and accumulated energy E2 is derived. The radiation light quantity is lowered repeatedly until the accumulated energy by still another laser device block LB makes contact with the profile formed according to the target value. In the example shown in (C) of FIG. 25, the accumulated energy E3 that is obtained while the radiation light quantity is being lowered is shown. In this case, an energy profile EP2 in the width direction of the paper is obtained.

Furthermore, as shown (D) of FIG. 25, an energy profile EP3 in the width direction of the paper covering the profile formed according to the target value is derived. From the energy profile EP3 in the width direction of the paper derived as described above, the accumulated energy by the laser light radiated to the division SP group SPG-H in the width direction of the paper, that is, the radiation light quantity of each laser device LD included in the laser device blocks LB01 to LB16, can be derived.

The above-mentioned process is performed over the paper feeding direction in the image forming region of the continuous paper P, that is, the process is performed for each division SP in the paper feeding direction, and the accumulated energy for the image forming region of the continuous paper P is derived per unit width in the width direction of the paper. The accumulated energy derived as described above is stored in the RAM 203 so as to correspond to each position of the division SP. The radiation light quantity of each laser device LD included in the laser device blocks LB01 to LB16 can be derived from the derived accumulated energy by using the predetermined feeding speed of the continuous paper P. Hence, instead of the accumulated energy, the derived radiation light quantity of the laser device LD may be stored in the RAM 203 so as to correspond to each position of the division SP.

In this exemplary embodiment, the case in which the energy profile in the width direction of the paper is derived until the target value is reached while the radiation light quantity of the laser light is gradually lowered from the maximum radiation light quantity has been described; however, the method for deriving the energy profile is not limited to this method. For example, the energy profile in the width direction of the paper may be derived until the radiation light quantity of the laser light becomes the target value or more while the radiation light quantity of the laser light is gradually increased or decreased from a predetermined radiation light quantity including the minimum radiation light quantity.

Next, at step S140, the maximum value of the accumulated energy in the paper feeding direction is derived and the radiation light quantity profile of the laser light is derived. In this exemplary embodiment, the profile is developed by using the one-dimensional accumulated energy derived as described above in the width direction of the paper.

In other words, at step S140, the radiation light quantity profile indicating the distribution of the radiation light quantity of the laser light is derived from the accumulated energy at each position in the paper feeding direction over the width direction of the paper. More specifically, first, for the division SP group in which individual division SP are arranged continuously in the paper feeding direction in the image forming region of the continuous paper P, the maximum value of the accumulated energy is derived and the radiation light quantity profile is derived. And then, the radiation light quantity profile is derived repeatedly over the width direction of the paper.

FIG. 24 shows an example of a region serving as an object from which the radiation light quantity profile is derived in the image forming region of the continuous paper P. In other words, FIG. 24 shows an example of a division SP group SPG-V in which individual divisions SP are arranged continuously in the paper feeding direction in the image forming region of the continuous paper P in the case that the radiation light quantity profile in the paper feeding direction is derived over the width direction of the paper.

Figure 26:
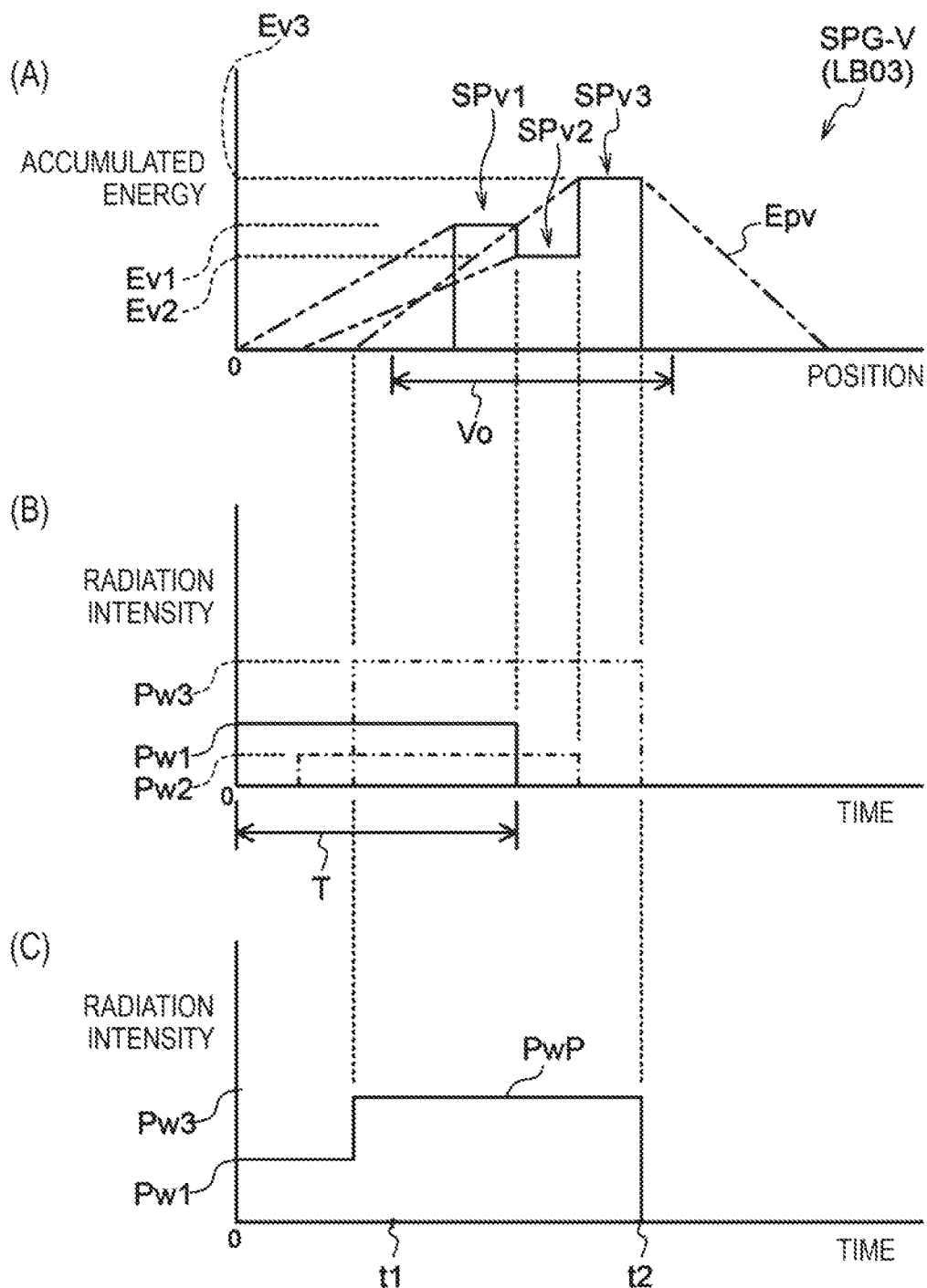
FIG. 26 is a schematic diagram showing an example of the process for deriving the radiation light quantity profile by using the maximum value of the accumulated energy.

FIG. 26 shows an example of the process for deriving the radiation light quantity profile by using the maximum value of the accumulated energy with respect to the division SP group SPG-V.

(A) of FIG. 26 shows an example of the distribution of the accumulated energy in the division SP group SPG-V corresponding to the laser device block LB03. In the example shown in (A) of FIG. 26, the accumulated energy is distributed in the order of accumulated energy Ev1, Ev2 and EV3 so as to correspond to the divisions SPv1, SPv2 and SPv3 arranged sequentially from the upstream side of the paper feeding direction. For example, since the radiation light quantities of the laser light radiated from all the laser devices LD included in the laser device block LB03 are accumulated to obtain the accumulated energy, the actual accumulated energy has the characteristic EPv indicated by two-dot chain lines. In this case, the laser devices LD included in the laser device block LB03 must be controlled in units of the divisions SP in the paper feeding direction to obtain each of the accumulated energy Ev1, Ev2 and EV3, whereby the control of the laser device block LB becomes complicated.

Hence, in this exemplary embodiment, the radiation light quantity profile is derived by using the maximum value of the accumulated energy in the paper feeding direction on the assumption that each laser device block LB is controlled. In other words, as shown in (B) of FIG. 26, for the purpose of obtaining the accumulated energy Ev1, laser light having a predetermined radiation light quantity is radiated during the time T in which the laser device block LB03 passes through the division SPv1, that is, during the time (feeding time) in which the laser light from the 20 laser devices LD included in the laser device block LB03. This predetermined radiation light quantity may merely be obtained by averaging the accumulated energy Ev1 in the laser device block LB03, that is, by dividing the accumulated energy Ev1 by the number (20) of the laser devices LD. More specifically, a radiation light quantity Pw1 can be obtained by dividing the accumulated energy Ev1 by the time T and by further dividing by the number (20) of the laser devices LD.

Furthermore, the radiation light quantity Pw2 for obtaining the accumulated energy Ev2 and the radiation light quantity Pw3 for obtaining the accumulated energy Ev3 can also be obtained similarly.

As shown in (B) in FIG. 26, for the purpose of obtaining the respective accumulated energy Ev1, Ev2 and EV3, the laser devices LD are driven so that the radiation light quantities become Pw1, Pw2 and Pw3 in the laser device block LB03 with the lapse of time. However, since the 20 laser devices LD included in the laser device block LB03 are driven simultaneously, it is difficult to drive the laser device block LB03 so that each of the respective accumulated energy Ev1, Ev2 and EV3 is obtained. Hence, in this exemplary embodiment, the radiation light quantity profile indicating the distribution of the radiation light quantities of the laser light is derived by using the maximum value of the accumulated energy in the paper feeding direction.

In other words, as shown in (C) of FIG. 26, the radiation light quantity is set so as to become equal to any one of the radiation light quantities Pw1, Pw2 and Pw3; the radiation light quantities Pw1, Pw2 and Pw3 are the maximum values of the radiation light quantities corresponding to the maximum values of the accumulated energy Ev1, Ev2 and EV3; and then, the radiation light quantity profile PwP indicating the distribution of the radiation light quantities of the laser light is derived.

The above-mentioned process is performed over the width direction of the paper in the image forming region of the continuous paper P, that is, for each division SP in the width direction of the paper, and the radiation light quantity profile PwP for each laser device block LB is derived. The radiation light quantity profile PwP derived as described above is stored in the RAM 203 so as to correspond to the position of each division SP.

Although the case in which the method for preventing the deterioration of the laser device by averaging the accumulated energy for the laser device blocks LB and by suppressing the maximum current is considered has been described in this exemplary embodiment, the method for preventing the deterioration is not limited to this method. For example, the radiation light quantity may be changed.

Next, at step S150, each laser device block LB is driven according to each radiation light quantity profile PwP derived as described above. In other words, at step S150, the radiation light quantity profile for each laser device block LB derived at step S140 is read from the RAM 203. After that, the switching device for driving the laser device block LB in the timing determined by the radiation light quantity profile is controlled for each laser device block LB, and the laser light having the radiation light quantity determined by the radiation light quantity profile is radiated from the laser device block LB. Consequently, this program is ended.

However, in the width direction of the paper, in the case that the laser device blocks LB for the side edges, that is, the laser device blocks LB01 and LB16, are used as the laser device blocks LB taking charge of the vicinities of the ejecting limit positions of the ink drops in the width direction of the paper within the image forming region that is formed by the ink drops ejected onto the continuous paper P by the printing head 50, since the overlap of the laser light is scarce, the light quantity of the laser light by the laser device blocks LB for the side edges becomes dominant in the light quantity for drying that is set as the light quantity for drying the ink drops. For this reason, the light quantities of the lases light by the laser device blocks LB for the side edges for obtaining the light quantity for drying for the ink drops become large. Hence, the power consumption of the laser device blocks LB for the side edges increases or the laser device blocks LB for the side edges are degraded more than the other laser device blocks LB. Furthermore, in the case that the electric power for obtaining the light quantity for drying the ink drops exceeds the upper limit of the electric power capable of driving the laser devices of the laser device blocks LB for the side edges, the light quantity for drying the ink drops cannot be obtained, and uneven drying of the ink drops occurs.

Hence, in this exemplary embodiment, the laser device blocks LB for the side edges can be positioned in the regions beyond the image forming region in the width direction of the paper so that larger amounts of laser light beams overlap with each other and are radiated onto the image forming region in the width direction of the paper. In other words, while attention is paid to the spread of the laser light radiated from the laser device LD, that is, the radiation angle and the size of the laser radiation region (on the continuous paper P) of the laser device LD, the laser devices LD can be arranged so that the laser light beams of the plural laser devices at least in the width direction of the paper overlap inside the image forming region in the width direction of the paper.

Figure 27:
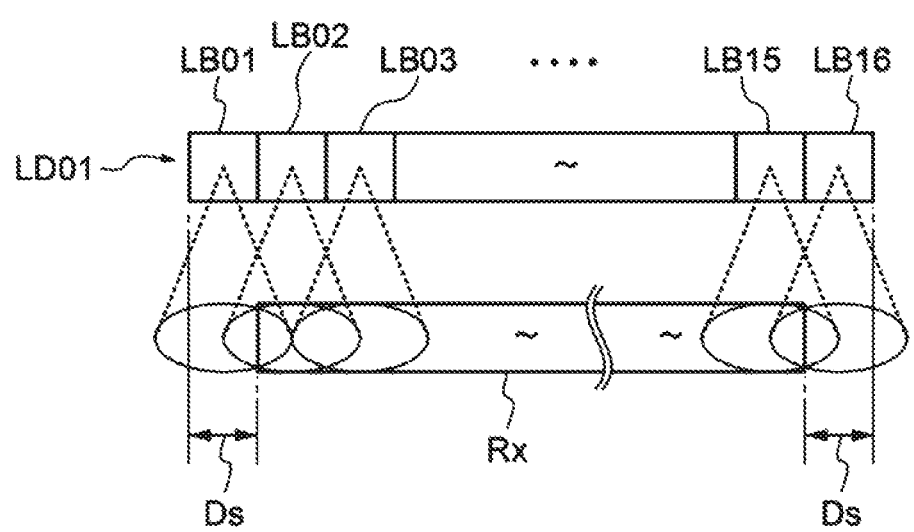
FIG. 27 is a view showing an example of the positional relationship between the image forming region in the width direction of the paper and the laser device blocks.

FIG. 27 shows an example of the positional relationship between the image forming region in the width direction of the paper and the laser device blocks LB. In the example shown in FIG. 27, the laser device blocks LB (LB01 and LB16) for the side edges are provided at positions away from the image forming region Rx in the width direction of the paper by a distance Ds in the width direction of the paper. With this arrangement, the laser device blocks LB in charge of the vicinities of the ejecting limit positions of the ink drops can be dispersed. As a result, the power consumption of the laser device blocks LB for the side edges does not increase and the laser device blocks LB for the side edges are not degraded significantly. Furthermore, uneven drying of ink drops can also be suppressed.

As described above, in this exemplary embodiment, since the accumulated energy is calculated in consideration of the spread of laser light at least in the width direction of the paper, the shortage of the accumulated energy can be suppressed even in the end regions of an ink image. As a result, uneven drying can be suppressed.

Furthermore, in this exemplary embodiment, the accumulated energy in consideration of the spread of the laser light in the width direction of the paper is obtained, the radiation energy profile in consideration of the spread of the laser light in the paper feeding direction is obtained, and the accumulated energy for the ink image on the continuous paper P and the radiation light quantity of the laser light for obtaining the accumulated energy are derived by using the arrangement interval of the laser devices in the width direction of the paper and the arrangement interval of the laser devices in the paper feeding direction as units, whereby the maximum value of the radiation light quantities of the laser light at the same time is used as the control value. Consequently, it is possible to suppress the radiation light quantity of the laser light from being set to a radiation light quantity including surplus.

Moreover, in this exemplary embodiment, in the case that the laser devices are arranged in the width direction of the paper, the laser arrangement region can be extended to the outside beyond the drying region on the continuous paper P. With this configuration, the upper limit value of the radiation light quantity of the laser light in the width direction of the paper can be suppressed and the deterioration of the laser devices can be suppressed.

What's more, in this exemplary embodiment, the one-dimensional accumulated energy is derived in the width direction of the paper with respect to an ink image and developed in the paper feeding direction. Hence, the process for deriving the radiation light quantity profile of the laser light for obtaining the target accumulated energy can be simplified.

Still further, in this exemplary embodiment, in the case that the radiation energy of the laser light is accumulated in the paper feeding direction, the laser light having been spread outside the laser unit can be excluded from the accumulation. With this configuration, the influence of the error for the target value at the time when the accumulated energy is derived can be suppressed.

Although the present invention has been described using the exemplary embodiment, the technological scope of the disclosed technology is not limited to the scope described in the above-mentioned exemplary embodiment. The above-mentioned exemplary embodiment can be modified or improved variously without departing from the gist of the invention, and the embodiments having been modified or improved are also included in the technological scope of the disclosed technology.

In addition, in this exemplary embodiment, although the case in which the drying process is realized by a software configuration has been described, the disclosed technology is not limited to this configuration, and the drying process may be realized, for example, by a hardware configuration.

As an embodiment in this case, for example, an embodiment is available in which a functional device for executing the same process as that of the controller 20 is used. In this case, increase in the speed of the process is anticipated in comparison with the above-mentioned exemplary embodiment.

Furthermore, although the continuous paper P is used as a recording medium in the exemplary embodiment, the type of the recording medium is not limited to the continuous paper. For example, cut paper, such as A3 and A4, may also be used; moreover, the material of the recording medium is not limited to paper, but a kind of material to which ink drops are fixed by radiating laser light onto the material can also be used. Still further, although drying is intended to be performed in this exemplary embodiment, since even the laser radiation light quantity insufficient for complete drying contributes to the improvement in image quality, the accumulated energy to be set as the target can be changed depending on the purpose of improvement.

The type of the laser light in the above-mentioned exemplary embodiment is not limited particularly. For example, in addition to laser devices for radiating infrared laser light having the wavelength of the infrared region, laser devices for radiating ultraviolet laser light having the wavelength of the ultraviolet region may also be used.

What is claimed is:

1. A laser driving control apparatus comprising:
   a driver that drives, at a constant voltage, a laser light source that radiates laser light, by supplying a pulse signal in which a plurality of pulses is generated at a predetermined cycle, each of the plurality of pulses having a pulse width that is changeable; and
   a controller that performs control to change the pulse width of each of the plurality of pulses of the pulse signal, so that a first change amount of the pulse width from the pulse width before first change at a time when a present-time pulse width is changed, to a preceding pulse width prior to reaching a pulse width at which a target light quantity is obtained stably, is larger than a second change amount of the pulse width from the pulse width before first change at a time when the present-time pulse width is changed, to a target pulse width corresponding to a driving current at an ON time of the laser light source in a steady state in which the target light quantity is obtained stably.

2. The laser driving control apparatus according to claim 1, wherein the controller performs control to change the pulse width of each of the plurality of pulses of the pulse signal, so that an average light quantity of at least one cycle of the predetermined cycle anticipated from the driving current at the ON time of the laser light source in the steady state, is larger than a light quantity of the laser light generated depending on the pulse width changed by the second change amount in the steady state.

3. The laser driving control apparatus according to claim 1, wherein the controller performs control to change the pulse width of each of the plurality of pulses of the pulse signal, so that the first change amount is larger than the second change amount, by making a change to increase or decrease the pulse width.

4. The laser driving control apparatus according to claim 1, wherein the controller performs control to change the pulse width of each of the plurality of pulses of the pulse signal until the target light quantity is obtained.

5. The laser driving control apparatus according to claim 1, wherein the controller comprises a derivation section that derives a first driving current at an ON time of the laser light source at the present time, and a second driving current at an ON time of the laser light source after a predetermined time shorter than a time determined by a thermal time constant that is set when the laser light source is driven by the present-time pulse width, and
the controller performs control to change the pulse width of the pulse signal after a predetermined time, so that a light quantity emitted from the laser light source is the target light quantity based on the first driving current and the second driving current derived by the derivation section.

6. The laser driving control apparatus according to claim 5, wherein the controller performs control to obtain the pulse width of the pulse signal for each predetermined time at predetermined time intervals, so that the light quantity radiated from the laser light source is the target light quantity, and to sequentially update the pulse width of the pulse of the pulse signal with the obtained each pulse width, by using thermal time constant information of the laser light source.

7. The laser driving control apparatus according to claim 1, wherein
the laser light source comprises a plurality of laser devices being arranged so that laser light beams radiated from the plurality of laser devices partially overlap with each other, and
the controller performs control to set the predetermined cycle, so that an error between an average light quantity and the target light quantity, in one cycle in which the laser light source is turned ON/OFF in a distribution of the light quantity of the laser light radiated from each of the plurality of laser devices, is suppressed.

8. The laser driving control apparatus according to claim 7, wherein the predetermined cycle is a frequency at which the error between the average light quantity and the target light quantity is a predetermined threshold value or less.

9. A drying apparatus comprising:
the laser driving control apparatus according to claim 1, and
a drying controller that controls the controller, in case that at least part of an image region formed by liquid drops ejected according to image information is included in a radiation region of the laser light radiated from the laser light source, so as to control the laser light source with a duty turning ON/OFF the laser light source, so that the light quantity corresponding to a drying light quantity having been set as a light quantity for drying the liquid drops is obtained.

10. The drying apparatus according to claim 9, wherein the drying controller controls the duty. so that a light quantity not less than a light quantity corresponding to a drying light quantity having been set as a light quantity for drying the liquid drops at an end of the image region included in the radiation region of the laser light, is obtained.

11. The drying apparatus according to claim 9, wherein the drying controller performs control to dry the liquid drops, while relatively moving the image region and the laser light source.

12. The drying apparatus according to claim 9, wherein the drying controller controls the duty of the laser light for radiating respective liquid drops, in case that a plurality of drying light quantities has been set as the light quantity for drying the liquid drops included in the image region, such that the plurality of drying light quantities of the image region is set, so that the light quantity corresponding to common drying light quantity derived based on the plurality of drying light quantities is obtained.

13. An image forming apparatus comprising:
an ejecting unit that ejects liquid drops onto a recording medium according to image information,
a feeding unit that feeds the recording medium,
the drying apparatus according to claim 9, and
a controlling unit that controls the ejecting unit, the feeding unit and the drying apparatus.

14. A non-transitory computer readable medium storing a laser driving control program causing a computer to execute a process for laser driving control, the process comprising:
driving, at a constant voltage, a laser light source that radiates laser light, by supplying a pulse signal in which a plurality of pulses is generated at a predetermined cycle, each of the plurality of pulses having a pulse width that is changeable; and
performing control to change the pulse width of each of the plurality of pulses of the pulse signal, so that a first change amount of the pulse width at a time when a present-time pulse width is changed, to a preceding pulse width prior to reaching a pulse width at which a target light quantity is obtained stably, is larger than a second change amount of the pulse width at a time when the present-time pulse width is changed, to a target pulse width corresponding to a driving current at an ON time of the laser light source in a steady state in which the target light quantity is obtained stably.

15. A non-transitory computer readable medium storing a drying program causing a computer to execute a process for drying, the process comprising:
driving, at a constant voltage, a laser light source that radiates laser light, by supplying a pulse signal in which a plurality of pulses is generated at a predetermined cycle, each of the plurality of pulses having a pulse width that is changeable;
performing control to change the pulse width of each of the plurality of pulses of the pulse signal, so that a first change amount of the pulse width at a time when a present-time pulse width is changed, to a preceding pulse width prior to reaching a pulse width at which a target light quantity is obtained stably, is larger than a second change amount of the pulse width at a time when the present-time pulse width is changed, to a target pulse width corresponding to a driving current at an ON time of the laser light source in a steady state in which the target light quantity is obtained stably; and performing control, in case that at least part of an image region formed by liquid drops ejected according to image information is included in a radiation region of the laser light radiated from the laser light source, so as to control the laser light source with a duty turning ON/OFF the laser light source, so that the light quantity corresponding to a drying light quantity having been set as a light quantity for drying the liquid drops is obtained.

* * * * *